United States Patent
Asano et al.

(10) Patent No.: US 8,362,364 B2
(45) Date of Patent: Jan. 29, 2013

(54) WIRING BOARD ASSEMBLY AND MANUFACTURING METHOD THEREOF

(75) Inventors: Toshiya Asano, Ichinomiya (JP); Shinnosuke Maeda, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 258 days.

(21) Appl. No.: 12/705,776

(22) Filed: Feb. 15, 2010

(65) Prior Publication Data

US 2010/0208442 A1 Aug. 19, 2010

(30) Foreign Application Priority Data

Feb. 16, 2009 (JP) ................... 2009-033314
Jun. 2, 2009 (JP) ................... 2009-133548

(51) Int. Cl.
*H05K 1/16* (2006.01)
(52) U.S. Cl. ....................... 174/260; 361/783
(58) Field of Classification Search .......... 361/760, 361/782, 783, 795; 174/250, 254, 260; 257/723, 257/724
See application file for complete search history.

(56) References Cited

U.S. PATENT DOCUMENTS

| 6,014,317 A * | 1/2000 | Sylvester | 361/760 |
| 6,078,506 A | 6/2000 | Sugahara | |
| 7,482,686 B2 * | 1/2009 | Zhao et al. | 257/710 |
| 7,619,308 B1 * | 11/2009 | Gektin et al. | 257/704 |

FOREIGN PATENT DOCUMENTS

| JP | 10-223698 A | 8/1998 |
| JP | 11-345890 A | 12/1999 |
| JP | 2002 026171 | 1/2002 |
| JP | 2002 026500 | 1/2002 |
| JP | 2007 299887 | 11/2007 |
| JP | 2007-299887 A | 11/2007 |
| JP | 2009-081357 A | 4/2009 |

OTHER PUBLICATIONS

Japanese Patent Office, English translation of Office Action issued in corresponding Japanese application 2009-033314, mailed Oct. 30, 2012.
Japanese Patent Office, Office Action issued in corresponding Japanese application 2009-033314, mailed Oct. 30, 2012.

* cited by examiner

*Primary Examiner* — Yuriy Semenenko
(74) *Attorney, Agent, or Firm* — Stites & Harbison PLLC; Jeffrey A. Haeberlin; Nicolo Davidson

(57) ABSTRACT

A wiring board assembly includes a rectangular plate-shaped wiring board having a plurality of resin insulation layers and conduction layers alternately laminated together to define opposite first and second main surfaces and a plurality of connection terminals arranged on the first main surface for surface contact with terminals of a chip and a rectangular frame-shaped reinforcing member fixed to the first main surface of the wiring board with the connection terminals exposed through an opening of the reinforcing member. The reinforcing member has a plurality of structural pieces separated by slits extending from an inner circumferential surface to an outer circumferential surface of the reinforcing member.

16 Claims, 19 Drawing Sheets

WIRING BOARD ASSEMBLY AND MANUFACTURING METHOD THEREOF

BACKGROUND OF THE INVENTION

The present invention relates to a wiring board assembly in which a wiring board is reinforced by a reinforcing member to prevent warpage or bending of the wiring board, and a method of manufacturing the wiring board assembly.

A semiconductor integrated circuit chip (hereinafter just referred to as "IC chip") has various applications such as a microprocessor for a computer. There is a tendency to provide an increasing number of terminals on the IC chip with a smaller terminal pitch for higher speed and performance of the IC chip. In general, a plurality of terminals are arranged closely in an array on a bottom side of the IC chip and are connected by flip-chip bonding to terminals of a motherboard. The direct mounting of the IC chip on the motherboard is however difficult due to a great difference between the terminal pitch of the IC chip and the terminal pitch of the motherboard. It has thus been common practice to produce a semiconductor package by mounting the IC chip on a chip mounting wiring board, and then, mount the semiconductor package on the motherboard as proposed in Japanese Laid-Open Patent Publication No. 2002-026500.

The IC chip is generally formed of a semiconductor material such as silicon having a thermal expansion coefficient of about 2.0 ppm/° C. to 5.0 ppm/° C. On the other hand, the chip mounting wiring board is often formed of a resin material having a higher thermal expansion coefficient than that of the semiconductor martial of the IC chip. As one type of the resin wiring board, a so-called "build-up wiring board" is already put to practical use. The build-up wiring board includes a core substrate and a plurality of resin insulation layers and conduction layers alternately laminated as build-up layers on top and bottom sides of the core substrate. The core substrate is commonly formed of a resin material such as a resin-impregnated glass fiber material (e.g. a glass/epoxy resin) and made much larger in thickness than the build-up layers, thereby having high rigidity to function as a reinforcement in the wiring board. Further, electrical wiring (e.g. through-hole conductors) is formed through the core substrate for electrical connection between the conduction layers on the top and bottom sides of the core substrate.

In recent years, high-frequency signals have been applied to the IC chip for high-speed operation of the IC chip. In this case, the mounting of the IC chip on the build-up wiring board results in a transmission loss of high-frequency signal or a circuit malfunction and causes interference with the high-speed operation of the IC chip due to high inductance of the electrical wiring in the core substrate. As a solution to such a problem, Japanese Laid-Open Patent Publication No. 2002-026171 proposes a coreless wiring board that has no core substrate of relatively large thickness. In the absence of the core substrate, the total wiring length of the coreless wiring board becomes shortened to reduce the transmission loss of high-frequency signals and to enable the high-speed operation of the IC chip. However, the absence of the core substrate leads to a smaller thickness and lower rigidity of the wiring board. It is thus likely that, when solder bumps for flip-chip bonding get cooled, the coreless wiring board will be warped to its chip mounting side under the influence of a thermal stress due to a difference in thermal expansion coefficient between the chip material and the wiring board material. The warpage or bending of the wiring board becomes a cause of a crack in the joint between the IC chip and the wiring board or an open failure in the IC chip and, by extension, a deterioration in yield rate and reliability of the semiconductor package.

In order to solve the above problem, there has been proposed a semiconductor package 100 that includes a resin wiring board 101, an IC chip 106 mounted on a chip mounting surface 102 of the resin wiring board 101 and a frame-shaped stiffener 105 (as a reinforcing member) fixed to the chip mounting surface 102 of the resin wiring board 101 with the IC chip 106 exposed through an opening of the stiffener 105 as shown in FIG. 39. The stiffener 105 may alternatively be fixed to a bottom surface 103 of the resin wiring board 101. When the stiffener 105 is formed of e.g. a metal material having higher rigidity than that of the resin wiring board 10, however, the resin wiring board 101 may be warped or bent under the influence of a thermal stress due to a difference in thermal expansion coefficient between the resin wiring board 101 and the metal stiffener 105.

SUMMARY OF THE INVENTION

As one measure to prevent such wiring board warpage or bending, Japanese Laid-Open Patent Publication No. 2007-299887 proposes a modified wiring board stiffener 110 having slits 114 to distribute a thermal stress on the stiffener 110 as shown in FIG. 40. In this proposed technique, the slits 114 are formed to extend from corners of an opening 112 toward corners 111 of the stiffener 110. Each of the slits 114 has one end open to the opening 112 and the other end located adjacent to the corner 111 of the stiffener 111 so that the stiffener 110 is not completely divided into separate pieces and is connected at some portions around the corners 111. There thus arises a possibility of concentration of the thermal stress on such connected corner portions of the stiffener 110 whereby the stiffener 110 may fail to prevent warpage or bending of the resin wiring board. The occurrence of warpage or bending of the resin wiring board causes a deterioration in yield rate and reliability of the semiconductor package due to the difficulty of properly mounting the IC chip on the wiring board.

It is therefore an object of the present invention to provide a wiring board assembly having a wiring board and a reinforcing member fixed to the wiring board so as to relieve a stress on the reinforcing member and prevent warpage or bending of the wiring board assuredly. It is also an object of the present invention to provide a method of manufacturing the wiring board assembly.

According to a first aspect of the present invention, there is provided a wiring board assembly, comprising: a rectangular plate-shaped wiring board having a plurality of resin insulation layers and conduction layers alternately laminated together to define opposite first and second main surfaces and a plurality of connection terminals arranged on the first main surface for surface contact with terminals of a chip; and a rectangular frame-shaped reinforcing member fixed to the first main surface of the wiring board with the connection terminals exposed through an opening of the reinforcing member, the reinforcing member having a plurality of structural pieces separated by slits extending from an inner circumferential surface to an outer circumferential surface of the reinforcing member.

According to a second aspect of the present invention, there is provided a wiring board assembly, comprising: a rectangular plate-shaped wiring board having a plurality of resin insulation layers and conduction layers alternately laminated together to define opposite first and second main surfaces and a plurality of connection terminals arranged on the first main surface for surface contact with terminals of a chip; and a rectangular frame-shaped reinforcing member fixed to the first main surface of the wiring board with the connection terminals exposed through an opening of the reinforcing member, the reinforcing member having a plurality of structural pieces separated by slits and a resin material filled in the slits to bond the structural pieces together by the resin material.

According to a third aspect of the present invention, there is provided a manufacturing method of a wiring board assembly, comprising: producing a rectangular plate-shaped wiring board, the wiring board having a plurality of resin insulation layers and conduction layers alternately laminated together to define opposite first and second main surfaces and a plurality of connection terminals arranged on the first main surface for surface contact with terminals of a chip; providing a rectangular frame-shaped reinforcing member, the reinforcing member being divided into a plurality of structural pieces by slits; filling a resin material in the slits to bond the structural pieces together by the resin material; and fixing the reinforcing member to the first main surface of the wiring board with the connection terminals exposed through an opening of the reinforcing member.

The other objects and features of the present invention will also become understood from the following description.

DESCRIPTION OF THE EMBODIMENTS

Figure 1:
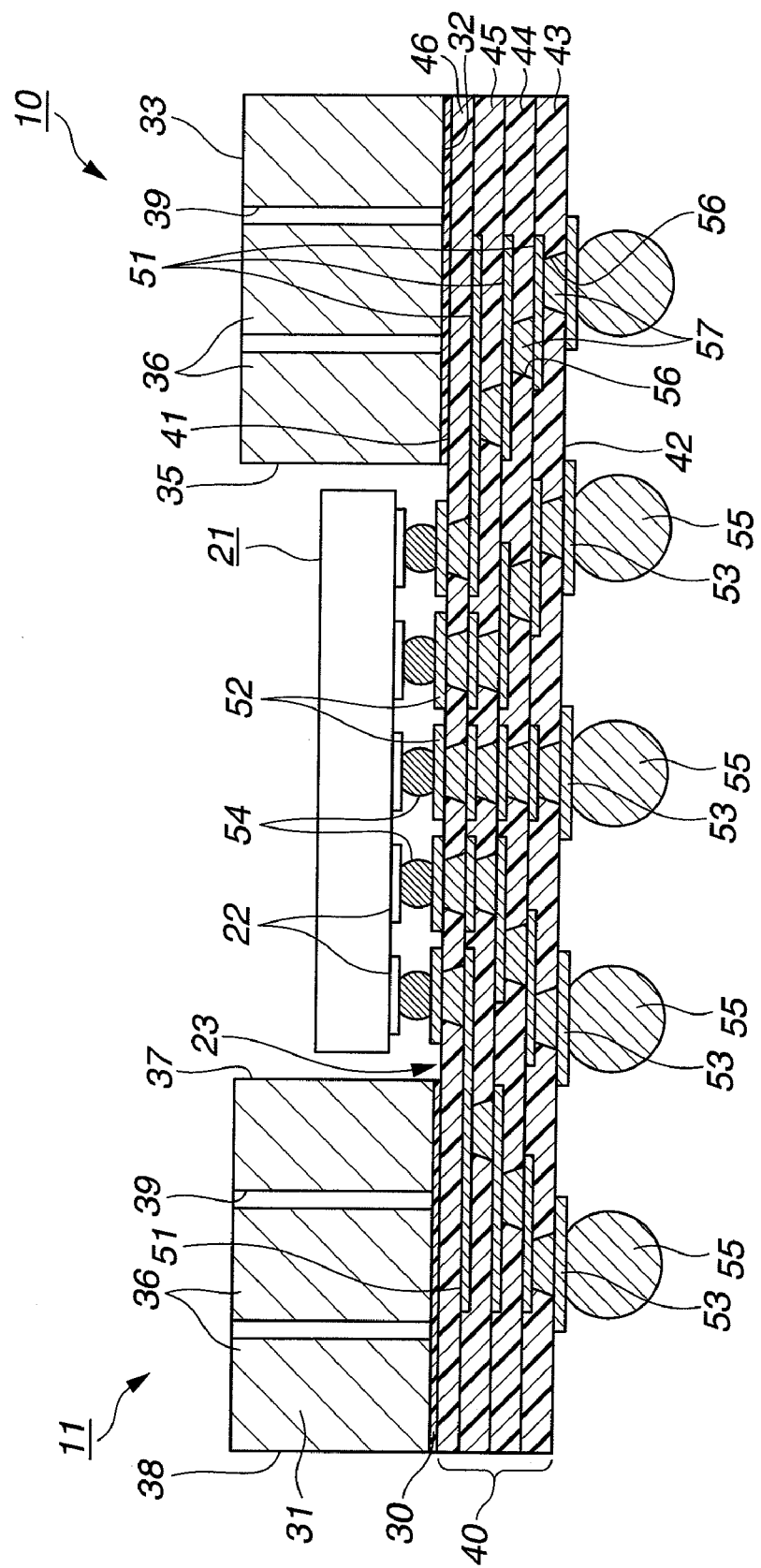
FIG. 1 is a section view of a wiring board assembly according to a first embodiment of the present invention.

The present invention will be described in detail below by way of first to sixteenth embodiments, in which like parts and portions are designated by like reference numerals to avoid repeated explanations thereof. In the following description, the terms "top" and "bottom" are used for purposes of illustration and are not intended to limit the present invention to any particular orientation. Further, the parameter "thermal expansion coefficient" means an average of measurements at a temperature between 0° C. and a glass transition temperature Tg.

[First Embodiment]

Figure 2:
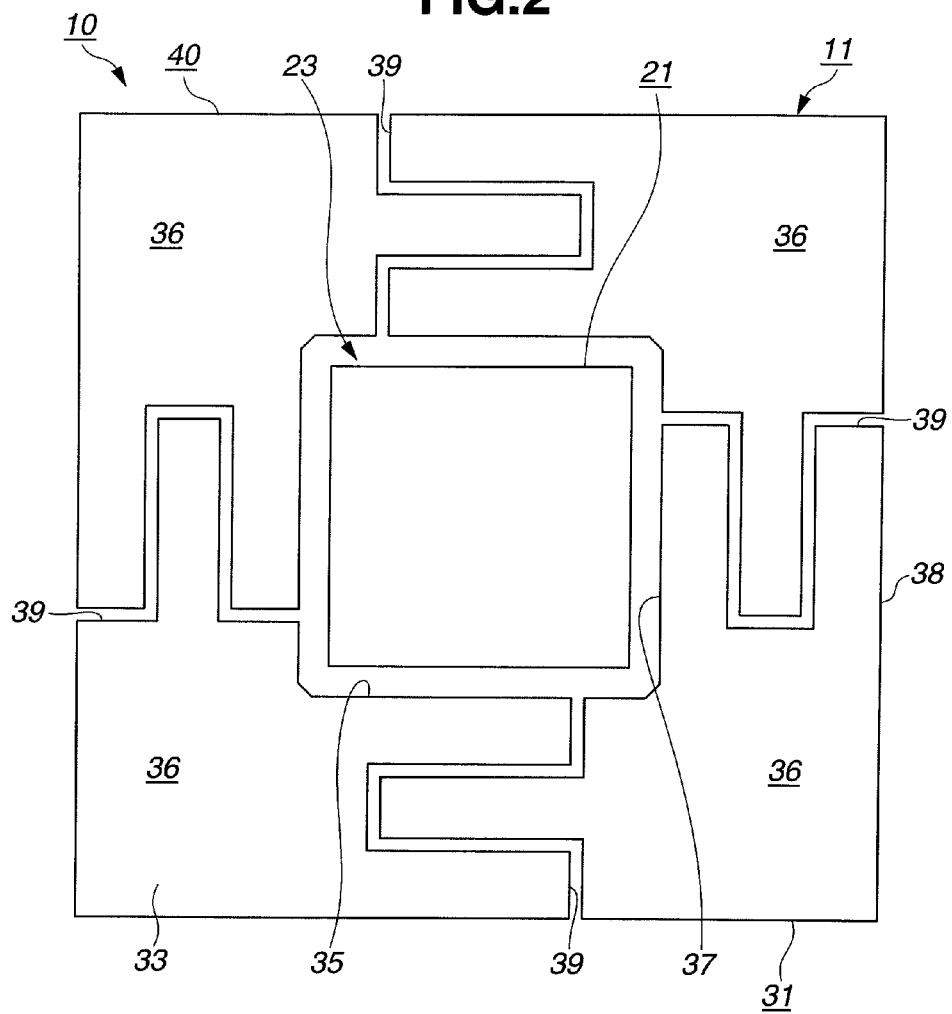
FIG. 2 is a top view of the wiring board assembly according to the first embodiment of the present invention.

As shown in FIGS. 1 and 2, a semiconductor package 10 according to the first embodiment of the present invention includes a wiring board 40, a chip 21 mounted on the wiring board 40 and a stiffener 31 fixed as a reinforcing member to the wiring board 40. In the first embodiment, the semiconductor package 10 has a ball grid array (BGA) configuration. The configuration of the semiconductor package 10 is not however limited to the BGA package configuration. The semiconductor package 10 may alternatively have a pin grid array (PGA) configuration, a land grid array (LGA) configuration or any other configuration. Further, the form of the chip 21 is not particularly limited. The chip 21 can be either a chip condenser, a semiconductor integrated circuit chip (IC chip) such as DRAM (Dynamic Random Access Memory) or SRAM (Static Random Access Memory) for use as a microprocessor in a computer, a MEMS (Micro Electro Mechanical System) element produced by a semiconductor manufacturing process, or any other chip component such as a chip transistor, a chip diode, a chip resistor, a chip coil or a chip inductor. In the first embodiment, the chip 21 is an IC chip made of silicon having a thermal expansion coefficient of 4.2 ppm/° C. and formed into a rectangular parallelepiped (plate) shape of 15.0 mm length, 15.0 mm width and 0.8 mm thickness. Herein, the assembly of the wiring board 40 and the stiffener 31 and, occasionally, the chip 21 is referred to as a wiring board assembly 11.

The wiring board 40 is formed into a rectangular plate shape of e.g. 50.0 mm length, 50.0 mm width and 0.4 mm thickness with a plurality of (in the first embodiment, four) resin insulation layers 43, 44, 45 and 46 and conduction layers 51. The resin insulation layers 43, 44, 45 and 46 and the conduction layers 51 are alternately laminated together, with no core substrate, so as to define two opposite top and bottom main surfaces 41 and 42 of the wiring board 40.

Each of the resin insulation layers 43 to 46 is made of an insulating resin material. The material of the resin insulation layers 43 to 46 can be selected as appropriate in terms of the insulation property, thermal resistance, moisture resistance etc required of the resin insulation layers 43 to 46. Suitable examples of the material of the resin insulation layers 43 to 46 are: thermosetting resins such as epoxy resin, phenol resin, urethane resin, silicone resin and polyimide resin; and thermoplastic resins such as polycarbonate resin, acrylic resin, polyacetal resin and polypropylene resin. A composite of a glass fiber material (e.g. a woven or nonwoven glass fabric) or an organic fiber material (e.g. polyamide fiber) with any of the above resin materials, or a resin-resin composite formed by e.g. impregnating a fluorocarbon resin substrate of three-dimensional network structure (e.g. continuously porous polytetrafluoroethylene (PTFE) substrate) with a thermosetting resin (e.g. epoxy resin), can also be used as the material of the resin insulation layers 43 to 46. In the first embodiment, the insulation layers 43 to 46 are formed of epoxy resin and have a thermal expansion coefficient of about 30 ppm/° C.

On the other hand, each of the conduction layers 51 is generally formed of copper and has a thermal expansion coefficient of about 17 ppm/° C. The form of the conduction layers 51 is not particularly limited. The conduction layers 51 can be formed by any known circuit formation process such as subtractive process, semi-additive process or full-additive process. Specific examples of the circuit formation process are copper foil etching, electroless copper plating and electrolytic copper plating. Alternatively, the conduction layers 51 can be formed by applying thin copper films by sputtering or chemical vapor deposition (CVD) and subjecting the thin copper films to etching, or by printing a conductive copper paste.

The wiring board 40 also includes a plurality of terminal pads 52 (as connection terminals) arranged in an array on a chip mounting area 23 of the top surface 41 (i.e. the top surface of the resin insulation layer 46) and solder bumps 54 arranged on the respective terminal pads 52 for connection to surface contact terminals 22 of the chip 21. The terminal pads 52 are generally formed of copper. The form of the terminal pads 52 is not also particularly limited. The terminal pads 52 can be formed by any known circuit formation process such as subtractive process, semi-additive process or full-additive process. Specific examples of the circuit formation process are copper foil etching, electroless copper plating and electrolytic copper plating. Alternatively, the terminal pads 52 can be formed by applying thin copper films by sputtering or chemical vapor deposition (CVD) and then subjecting the thin copper films to etching, or by printing conductive copper paste.

The wiring board 40 further includes a plurality of BGA pads 53 arranged in an array on the bottom surface 54 (i.e. the bottom surface of the resin insulation layer 43) and solder bumps 55 arranged on the respective BGA pads 53 for connection to a motherboard. The BGA pads can be formed in the same manner as the terminal pads 52.

Furthermore, the resin insulation layers 43 to 46 have a plurality of via holes 56 and via conductors 57 formed in the via holes 56 for connection of the conduction layers 51 to the terminal pads 52 and to the BGA pads 53. The via holes 56 can be formed by e.g. laser drilling process using a YAG laser or a carbon dioxide laser; whereas the via conductors 57 can be formed by e.g. plating. It is preferable that the via conductors 57 increase in diameter in the same direction for assured manufacturing of the coreless wiring board 40. In the first embodiment, each of the via holes 56 is shaped into a frustum of a cone and tapered down toward the top so that the via conductors 57 gradually increases in diameter toward the bottom.

The stiffener 31 is fixed to the top surface 41 of the wiring board 40 to provide sufficient rigidity to the wiring board 40 since the wiring board 40 has no core substrate and cannot secure sufficient rigidity by itself. More specifically, the stiffener 31 is formed into a rectangular frame shape of e.g. 50.0 mm length, 50.0 mm width and 2.0 mm thickness (as viewed from the top) and joined to the top surface 41 of the wiring board 40 in such a manner that the terminal pads 52 and the solder bumps 54 (and the chip 21, when mounted on the chip mounting area 23 of the top surface 41 of the wiring board 40) are exposed through a center opening 35 of the stiffener 31. In the first embodiment, the opening 35 is substantially rectangular in shape (as viewed from the top) and has a rounded square cross section of 20 mm length and 20 mm width where four rounded corners thereof are formed with a curvature radius of 1.5 mm.

As shown in FIG. 2, the stiffener 31 has a plurality of (in the first embodiment, four) structural pieces 36 separated by slits 39. The slits 39 extend from an inner circumferential surface 37 to an outer circumferential surface 38 of the stiffener 31 so that the stiffener 31 is completely divided into the separate structural pieces 36. The formation of such non-linear slits 39 makes it possible to, when there occurs a thermal stress on the stiffener 31 due to a difference in thermal expansion coefficient between the stiffener 31 and the wiring board 40 during manufacturing of the wiring board assembly 11 (semiconductor package 10), relieve the thermal stress on the stiffener 31 and prevent warpage or bending of the wiring board 40 effectively and assuredly.

Figure 14:
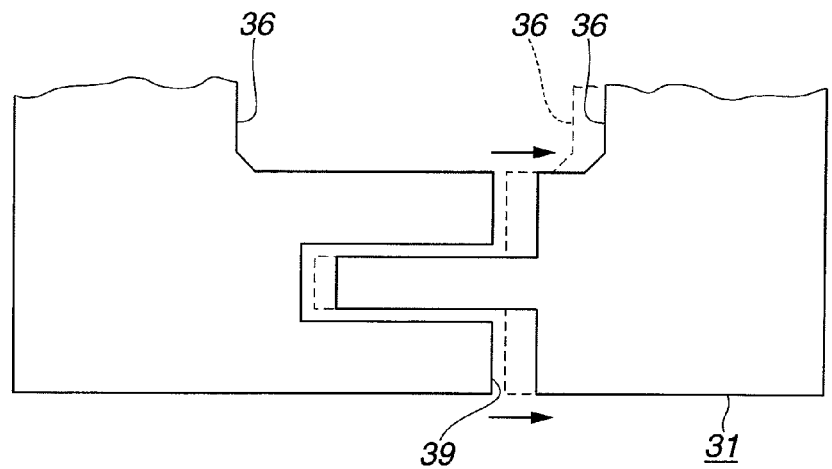
FIG. 14 is a schematic view of a stiffener of the wiring board assembly in a state where structural pieces of the stiffener are displaced in position relative to each other under a thermal stress.

In the first embodiment, the slits 39 are preferably formed into a non-linear shape and, more specifically, a crank shape with four right-angle bends (as viewed from the top) as shown in FIG. 2. The structural pieces 36 of the stiffener 31 are of the same L-like shape and same size, each of which has a recessed portion at one end thereof and a protruding portion on the other end, and are arranged symmetrically with respect to the center of the wiring board assembly 11 with the protruding portion of one of the structural pieces 36 engaged in the recessed portion of the other adjacent one of the structural pieces 36. In this structure, the structural pieces 36 of the stiffener 31 partly overlap each other in the plane direction of the stiffener 31 even if displaced in position to relieve the thermal stress as shown in FIG. 14. The wiring board 40 can be thus protected from warpage or bending assuredly by the overlap of the structural pieces 36 of the stiffener 31. Further, the formation of the structural pieces 36 in the same shape and size allows cost reduction as compared to the formation of the structural pieces 36 in different shapes. The symmetric arrangement of the structural pieces 36 also allows more effective and assured prevention of warpage or bending of the wiring board 40.

The structural pieces 36 of the stiffener 31 are preferably formed of a material having higher rigidity than the resin material of the wiring board 40. The use of such a high rigidity material makes it possible to, even when the stiffener 31 is made relatively small in thickness, provide sufficiently high rigidity to the wiring board 40 for high resistance to external stress so that the wiring board assembly 11 can combine a small thickness with high rigidity. Preferred examples of the material of the stiffener 31 are: metal materials such as iron, gold, silver, copper, copper alloy, iron-nickel alloy, silicon and gallium arsenide; ceramic materials such as low-temperature firing material e.g. alumina, glass ceramics or crystallized glass), aluminium nitride, silicon carbide and silicon nitride; and resin materials such as epoxy resin, polybutene resin, polyamide resin, polybutylene terephthalate resin, polyphenylene sulfide resin, polyimide resin, bismaleimide triazine resin, polycarbonate resin, polyphenylene ether resin and acrylonitrile butadiene styrene copolymer (ABS resin). A composite of a resin material and an inorganic material (e.g. a composite material in which a metal plate or ceramic plate is attached to a resin substrate) can also be suitably used as the material of the stiffener 31. In the first embodiment, the stiffener 31 (the structural pieces 36) is formed of copper and made larger in thickness than the wiring board 40 so that the coreless wiring board 40 can be reinforced properly by the stiffener 31. Further, the stiffener 31 has a thermal expansion coefficient of about 17 ppm/° C., which is lower than the thermal expansion coefficient (about 30 ppm/° C.) of the resin insulation layers 43 to 46 of the wiring board 40, in the first embodiment.

The stiffener 31 has a joint surface 32 held in surface contact with and joined to a circumferential area (around the chip mounting area 23) of the top surface 41 of the wiring board 40 and a non-joint surface 33 located opposite from the joint surface 32. There is no particular limit on the technique of fixing the stiffener 31 to the wiring board 40. The stiffener 31 can be fixed by any known technique to the wiring board 40 depending on the material and shape of the stiffener 31. In the first embodiment, the joint surface 32 of the stiffener 31 is fixed by an adhesive 30 to the circumferential area of the top surface 41 of the wiring board 40. As the adhesive 30, there can be used any appropriate one such as an acrylic adhesive, an epoxy adhesive, a cyanoacrylate adhesive or a rubber adhesive. The use of the adhesive 30 allows easy and assured fixing of the stiffener 31 to the wiring board 40.

The wiring board assembly 11 can be manufactured by the following procedure, including a wiring board production step, a solder bump forming step, a stiffener production step, a fixing step and a chip mounting step.

First, the wiring board 40 is produced in the wiring board production step.

Figure 3:
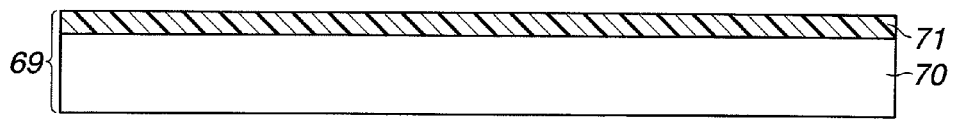
FIGS. 3 to 13 are schematic views showing a method of manufacturing the wiring board assembly according to the first embodiment of the present invention.
Figure 4:
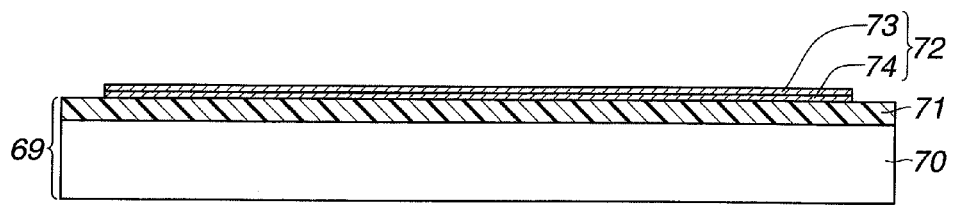
Figure 5:
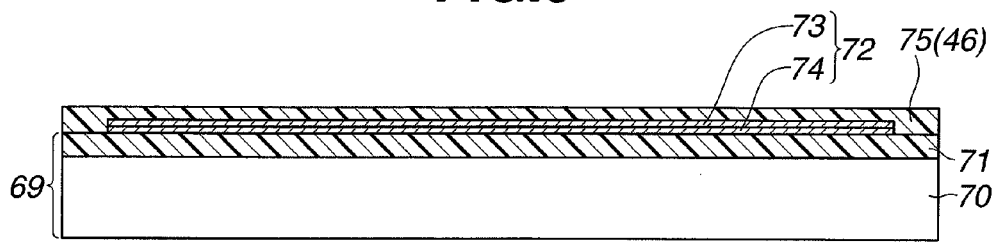
Figure 6:
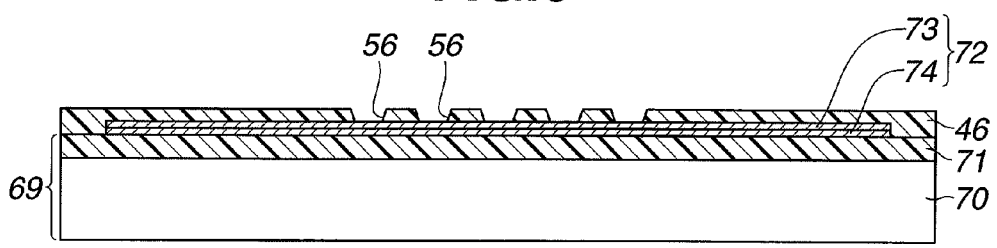
Figure 7:
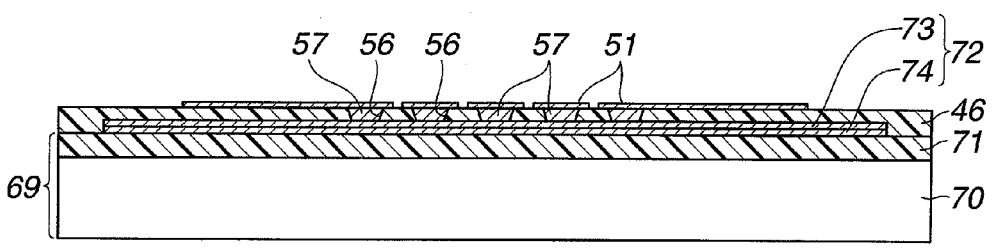
Figure 8:
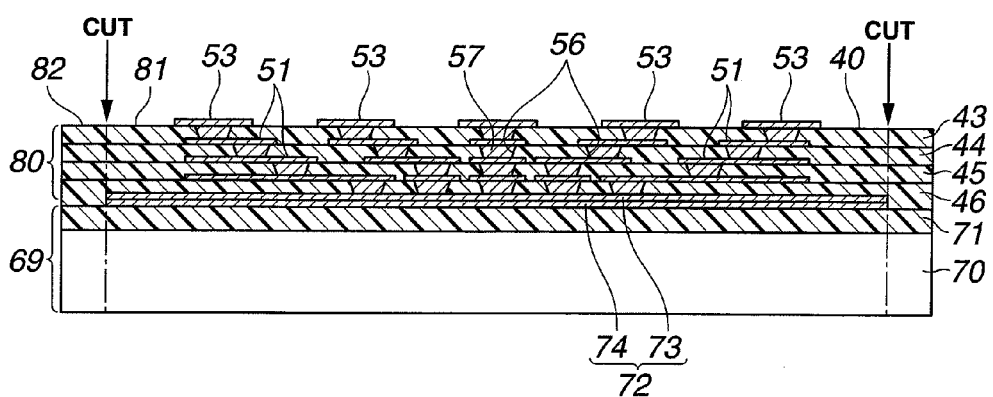

As shown in FIG. 3, a base material 69 is formed by preparing a support substrate 70 (e.g. glass/epoxy substrate) of sufficient strength and applying a resin insulation base film (e.g. epoxy resin film) to form a resin insulation base coat layer 71 on the support substrate 70. A laminated metal sheet material 72 is then placed on the base coat layer 71 of the base material 69 as shown in FIG. 4. Herein, the laminated metal sheet material 72 has two copper foil sheets detachably laminated together by metal plating (e.g. chromium plating). Upon placement of the laminated metal sheet material 72 on the base coat layer 71 of the base material 69, the base material 69 and the laminated metal sheet material 72 develops such adhesion that the laminated metal sheet material 72 would not become separated from the base coat layer 71 of the base material 69 in the subsequent production process. As shown in FIG. 5, an insulating resin sheet material 75 is placed to cover the laminated metal sheet material 72 and cured by heat pressing in a vacuum with a vacuum heat press machine to thereby form the resin insulation layer 46. The thus-formed resin insulation layer 46 has a center portion held in contact with the laminated metal sheet material 72 and a circumferential portion held in contact with the base coat layer 71 so as to seal the laminated metal sheet material 72. As shown in FIG. 6, the via holes 56 are formed by laser processing (drilling) the resin insulation layer 46 and subjected to desmearing to remove smears from the via holes 56. As shown in FIG. 7, the via conductors 57 are formed in the via holes 56 by a known circuit formation process such as electroless copper plating or electrolytic copper plating. Further, the conduction layer 51 is etched to define a wiring pattern on the resin insulation layer 46 by a known patterning process such as semi-additive process. The resin insulation layers 43 to 45 and the other conduction layers 51 are successively formed in the same manner as above, thereby yielding a laminate 80 in which the resin insulation layers 43 to 46 and the conduction layers 51 are alternately laminated together on the base material 69 via the laminated metal sheet material 72 as shown in FIG. 8. A portion 81 of the laminate 80 located on the laminated metal sheet material 72 is to be used as the wiring board 40 and is thus occasionally referred to as a "wiring board portion".

The wiring board portion 81 is cut from the laminate 80 with a dicing machine. At this time, the laminate 80 and the base material 60 (support substrate 70 and base coat layer 71) are cut simultaneously along the border between the wiring board portion 81 and its circumferential portion 82 so that the outer edge of the laminated metal sheet material 72 becomes exposed. Namely, the contact between the resin insulation layer 46 and the base coat layer 71 is lost upon removal of the circumferential portion 82 from the laminate 80. The wiring board portion 81 is thus bonded to the base material 69 only via the metal sheet material 72.

Figure 9:
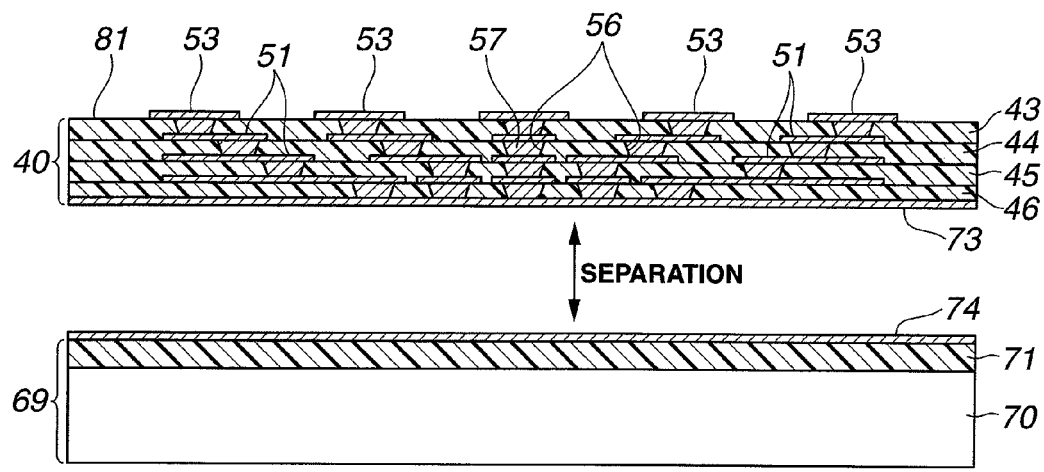
Figure 10:
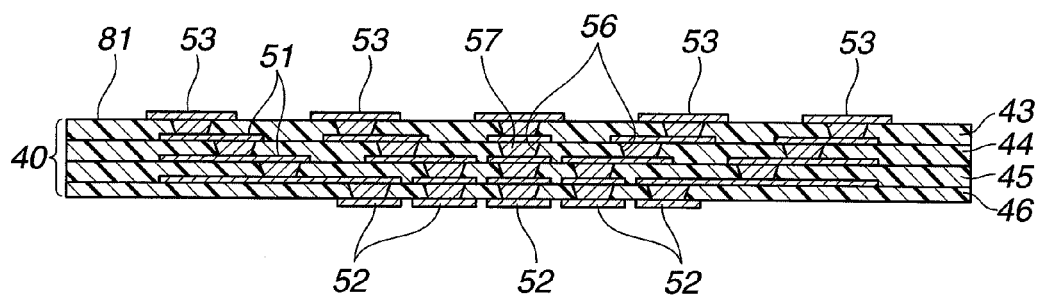

As shown in FIG. 9, the copper foil sheets 73 and 74 are detached from each other to separate the wiring board portion 81 from the base material 69. The copper foil sheet 73 on the bottom side of the wiring board portion 81 is subjected to patterning by etching, thereby forming the terminal pads 52 on the outermost resin insulation layer 46 as shown in FIG. 10. With this, the wiring board 40 is provided.

Figure 11:
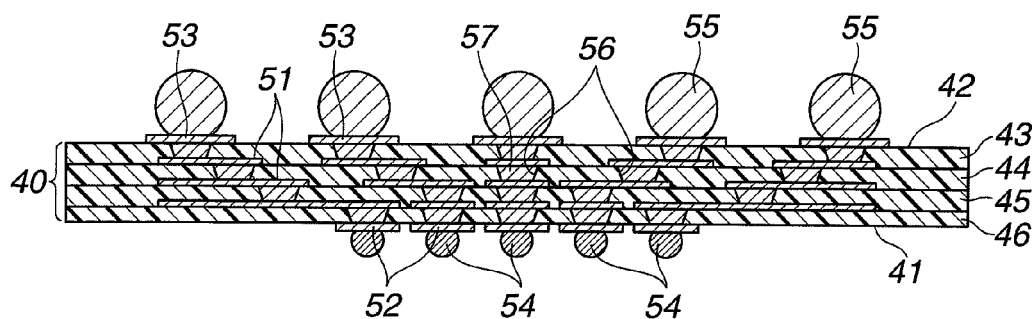

Subsequently, the solder bumps 54 are formed on the terminal pads 52 on the outermost resin insulation layer 46 of the wiring board 40 as shown in FIG. 11 by mounting solder balls on the terminal pads 52 with a solder ball mounting machine and reflowing the solder balls with heating at a given temperature. The solder bumps 55 are also formed on the BGA pads 53 on the outermost resin insulation layer 43 of the wiring board 40 in the same manner as above.

On the other hand, the structural pieces 36 of the stiffener 31 are produced by cutting a plate material (e.g. copper plate) with any known cutting machine in the stiffener production step.

Figure 12:
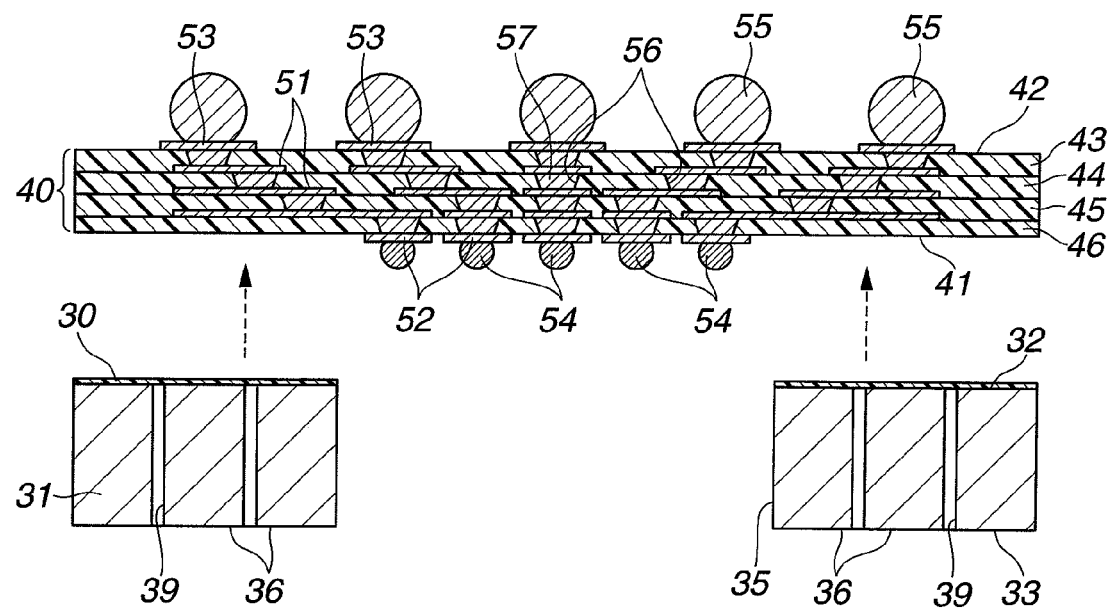
Figure 13:
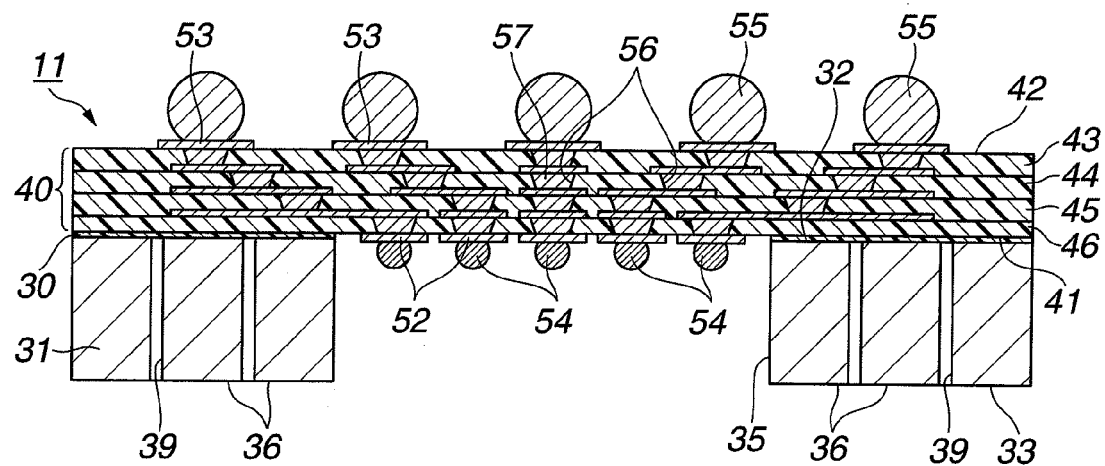

After that, the stiffener 31 is fixed to the top surface 41 of the wiring board 40 in the fixing step. As shown in FIG. 12, the adhesive 30 is first applied to the joint surface 32 of each of the structural pieces 36 of the stiffener 31. Then, the structural pieces 36 of the stiffener 31 are placed on the top surface 41 of the wiring board 40 to bring the joint surface 32 of each of the structural pieces 36 of the stiffener 31 into contact with the top surface 41 of the wiring board 40 and to engage the protruding portion of one of the structural pieces 36 in the recessed portion of the other adjacent one of the structural pieces 36. The adhesive 30 is cured with heating at e.g. about 150° C. Upon cooling the adhesive 30 to room temperature after the curing, the structural pieces 36 of the stiffener 31 are fixed by the adhesive 30 to the top surface 41 of the wiring board 40.

Alternatively, it is conceivable to produce the frame-shaped stiffener 31 in one piece, fixed the stiffener 31 to the wiring board 40, and then, divide the stiffener 31 by the slits 39 into the separate structural pieces 36. In this case, the stiffener 31 may be produced in one piece, with some parts of the slits 39 cut in the stiffener 31, and divided into the separate pieces 36 by cutting the remaining parts of the slits 39 in the stiffener 31 after fixing the stiffener 31 to the wiring board 40.

The chip 21 is finally mounted on the chip mounting area 23 of the wiring board 40 in the chip mounting step. The contact terminals 22 of the chip 21 are aligned with the solder bumps 54 of the wiring board 40 and joined to the solder bumps 54 of the wiring board 40 by reflowing the solder bumps 54 with heating.

It is accordingly possible for the wiring board assembly 11 to relieve the thermal stress on the stiffener 31 by the slits 39 and prevent warpage or bending of the wiring board 40 assuredly so that the chip 21 can be mounted on the wiring board 40 properly for improved yield rate and reliability of the semiconductor package 10.

[Second Embodiment]

Figure 15:
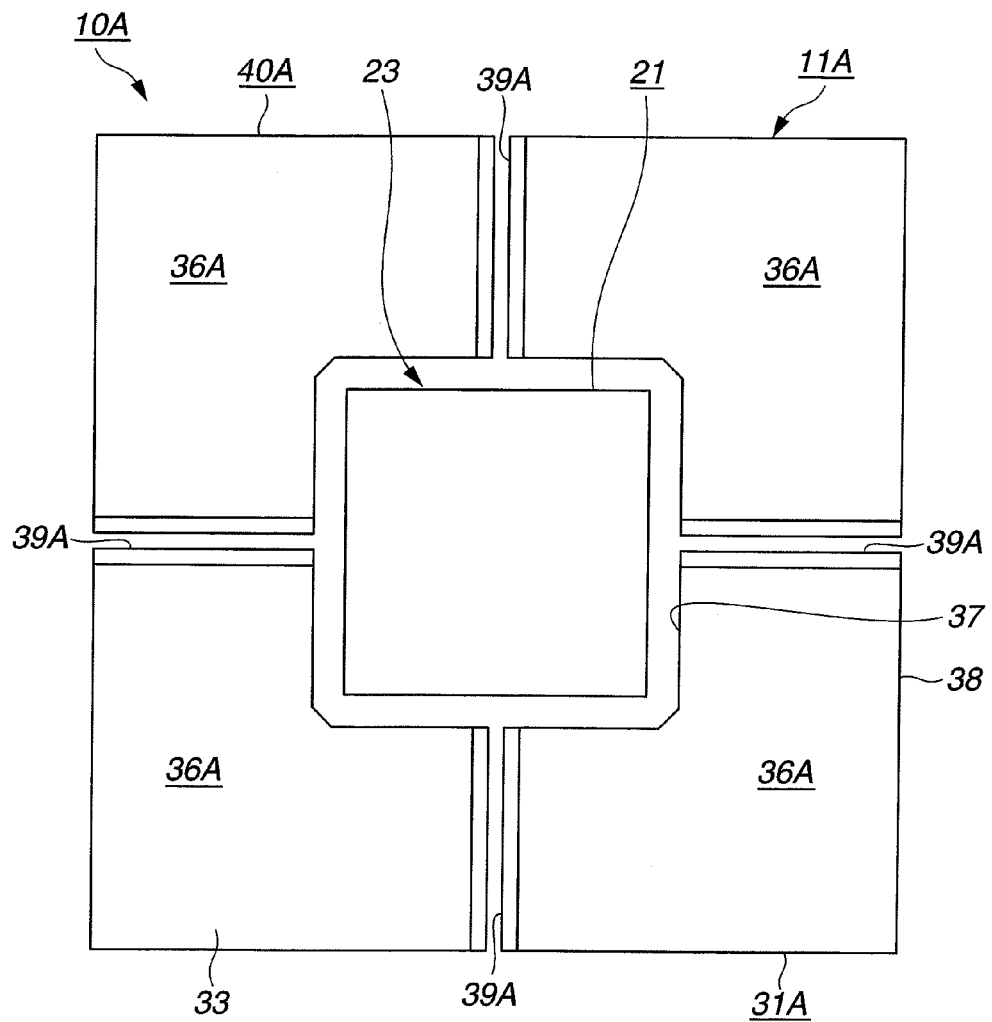
FIG. 15 is a top view of a wiring board assembly according to a second embodiment of the present invention.
Figure 16:
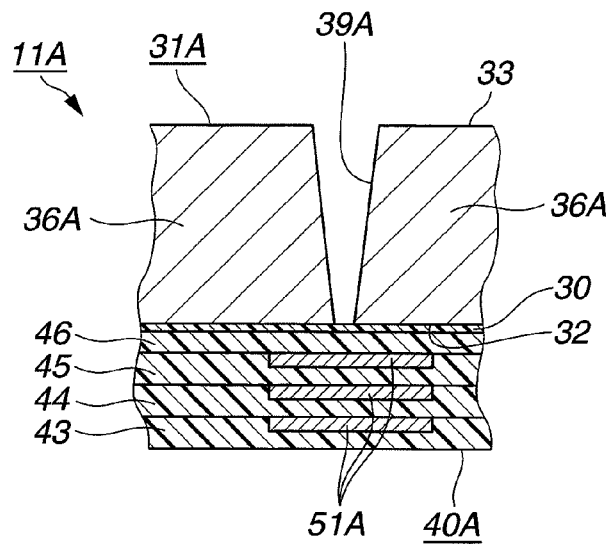
FIG. 16 is a section view of part of the wiring board assembly according to the second embodiment of the present invention.

A semiconductor package 10A according to the second embodiment of the present invention includes a wiring board 40A, a chip 21 mounted on the wiring board 40A and a stiffener 31A fixed as a reinforcing member to the wiring board 40A as shown in FIGS. 15 and 16. The assembly of the wiring board 40A and the stiffener 31A and, occasionally, the chip 21 is referred to as a wiring board assembly 11A. The wiring board assembly 11A of the second embodiment is structurally similar to the wiring board assembly 11 of the first embodiment, except that: the stiffener 31A has four structural pieces 36A separated by linear slits 39A; and the wiring board 40 has a plurality of plain conduction layers 51A each arranged between adjacent ones of the resin insulation layers 43 to 46 at positions corresponding to each of the slits 39A.

As shown in FIG. 15, the slits 39A are formed in the centers of the four sides of the rectangular stiffener 31A so as to extend linearly from the inner circumferential surface 37 to the outer circumferential surface 38 of the stiffener 31A in directions perpendicular to the sides of the stiffener 31A, respectively, so that the structural pieces 36A of the stiffener 31 has the same L shape and size. Even in the case where the slits 39A are linear in shape as in the second embodiment, it is possible to relieve a thermal stress applied to the stiffener 31A due to a difference in thermal expansion coefficient between the stiffener 31A and the wiring board 40A and to prevent warpage or bending of the wiring board 40A so that the chip 21 can be mounted on the wiring board 40A properly for improved yield rate and reliability of the semiconductor package 10A.

Further, each of the slits 39A is made smaller in width at the joint surface 32 than at the non-joint surface 33 of the stiffener 31A as shown in FIG. 16. In the second embodiment, the width of the slits 39A gradually decreases from the non-joint surface 33 to the joint surface 32 of the stiffener 31A so that the slits 39A are substantially V-shaped in cross section. It is possible to secure a wider area of the joint surface 32 of the stiffener 31A and fix the stiffener 31A to the wiring board 40A assuredly by decreasing the width of the slits 39A at the joint surface 32.

It is herein assumed that the portions of the wiring board 40A corresponding to the slits 39 of the stiffener 31 are lower in rigidity and strength and are thus susceptible to warpage or bending.

As one technique to reinforce and add rigidity and strength to these slit-corresponding portions of the wiring board 40A, the plain conduction layers 51A are arranged between the resin insulation layers 43 to 46 so as to correspond in position to each of the slits 39A. The plain conduction layers 51A are dummy conductors that do not have no connections to the via conductors 57 and thus do not perform an electrical function, but perform the function to reinforce the slit-corresponding portions of the wiring board 40A. It is thus possible to provide the wiring board assembly 11A with sufficient rigidity and strength so that the chip mounting area 23 of the wiring board 40A can secure flatness to mount thereon the chip 21.

[Third to Eighth Embodiments]

The shape and number of the structural pieces 36, 36A (i.e. the form, position and number of the slits 39, 39A) of the stiffener 31, 31A are not particularly limited to the above and can be modified as appropriate as in the following embodiments.

Figure 17:
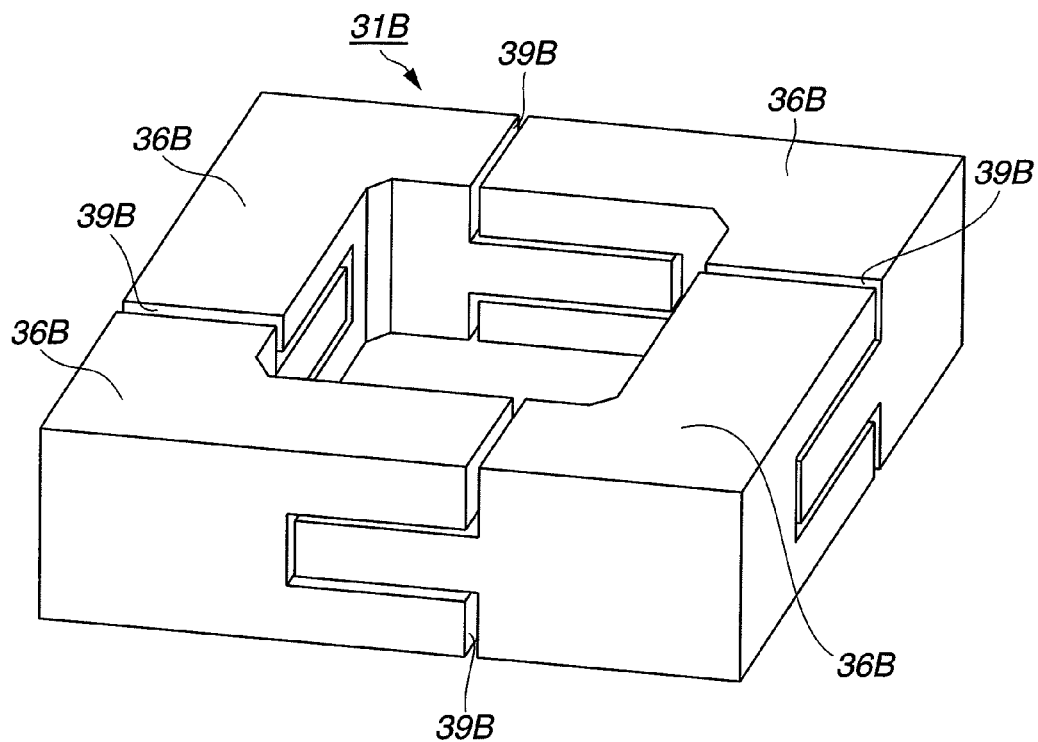
FIG. 17 is a perspective view of a stiffener for a wiring board according to a third embodiment of the present invention.

A stiffener 31B for a wiring board according to the third embodiment of the present invention (as a modification of the first embodiment) has four structural pieces 36B separated by non-linear slits 39B as shown in FIG. 17. In the third embodiment, the slits 39B are formed into a crank shape as viewed from the side in contrast to the first embodiment in which the slits 39 are a crank shape as viewed from the top.

Figure 18:
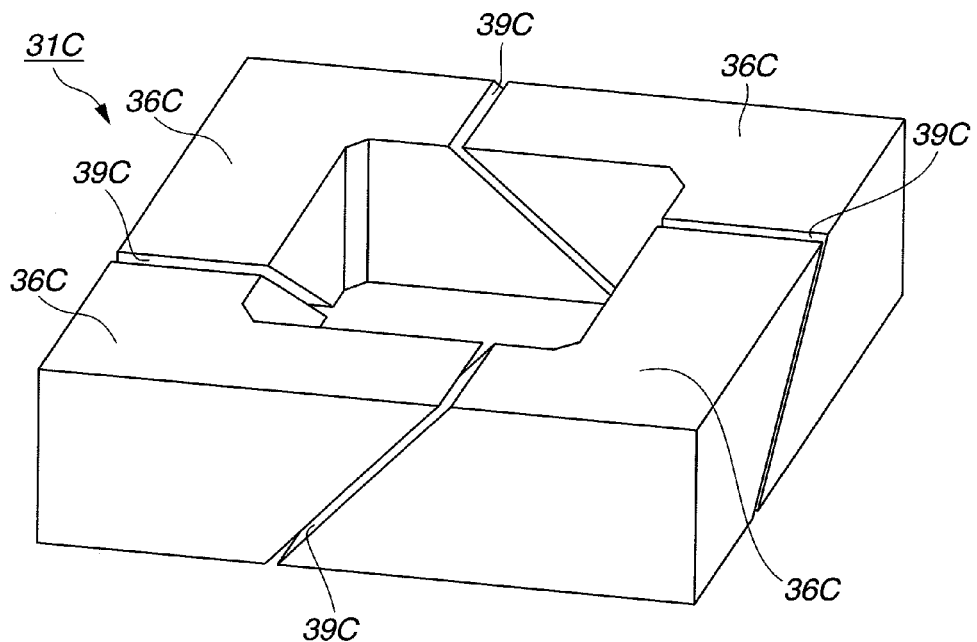
FIG. 18 is a perspective view of a stiffener for a wiring board according to a fourth embodiment of the present invention.
Figure 19:
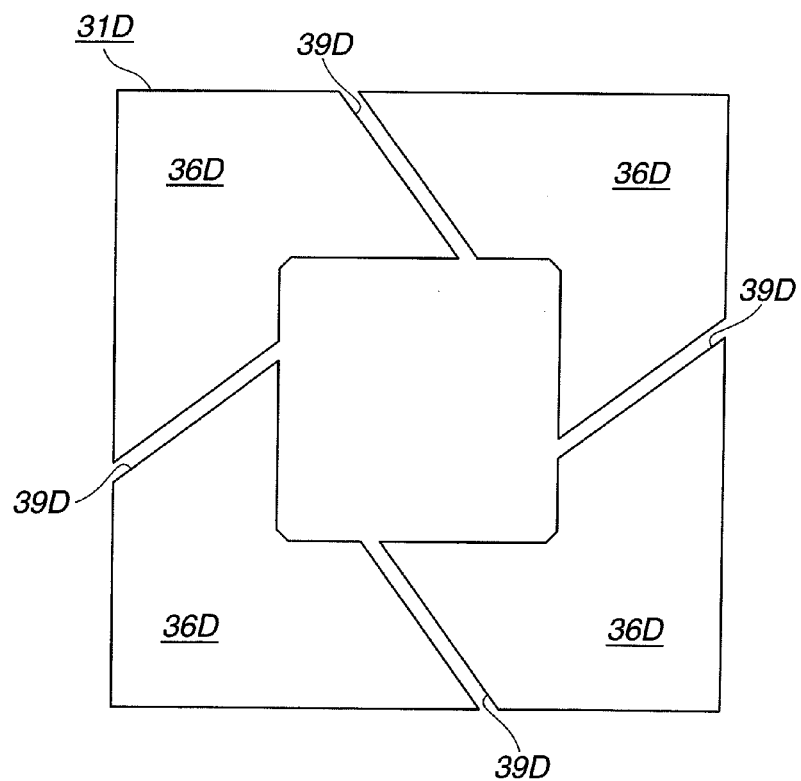
FIG. 19 is a perspective view of a stiffener for a wiring board according to a fifth embodiment of the present invention.

A stiffener 31C for a wiring board according to the fourth embodiment of the present embodiment (as one modification of the second embodiment) has four structural pieces 36C separated by linear slits 39C as shown in FIG. 18. A stiffener 31D for a wiring board according to the fifth embodiment of the present embodiment (as another modification of the second embodiment) has four structural pieces 36D separated by linear slits 39D as shown in FIG. 19. In the fourth and fifth embodiment, the slits 39C, 39D are inclined with respect to the respective sides of the stiffener 31C, 31D in contrast to the second embodiment in which the slits 39A are perpendicular to the respective sides of the stiffer 21A.

Figure 20:
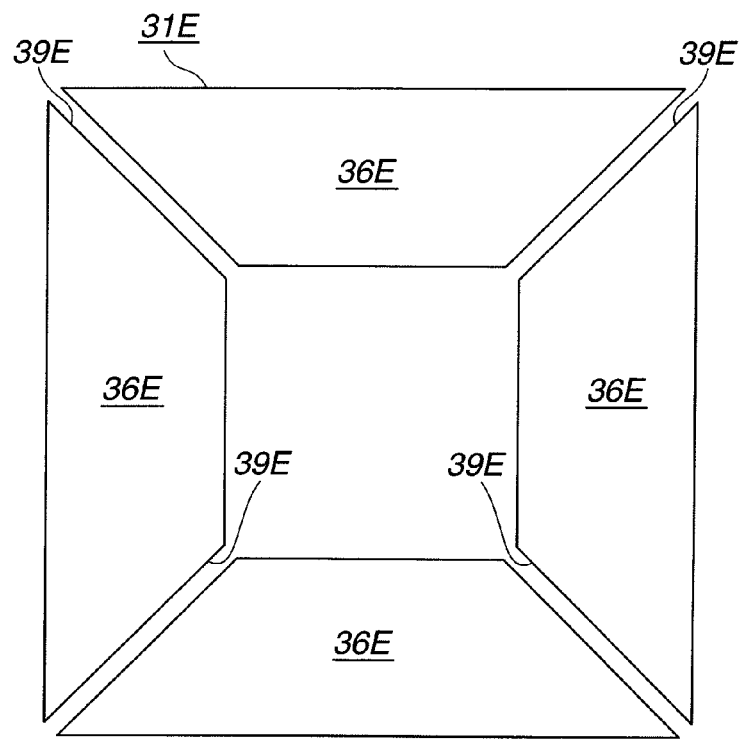
FIG. 20 is a perspective view of a stiffener for a wiring board according to a sixth embodiment of the present invention.

A stiffener 31E for a wiring board according to the seventh embodiment of the present invention has four structural pieces 36E separated by linear slits 39E as shown in FIG. 20. In the seventh embodiment, the slits 39 are formed in respective corner portions of the rectangular stiffener 31E so that the structural pieces 36E of the stiffener 31E have a trapezoidal shape as viewed from the top in contrast to the first to sixth embodiments in which the slits 39, 39A, 39B, 39C, 39D are formed in the centers of the respective sides of the rectangular stiffener 31, 31A, 31B, 31C, 31D.

Figure 21:
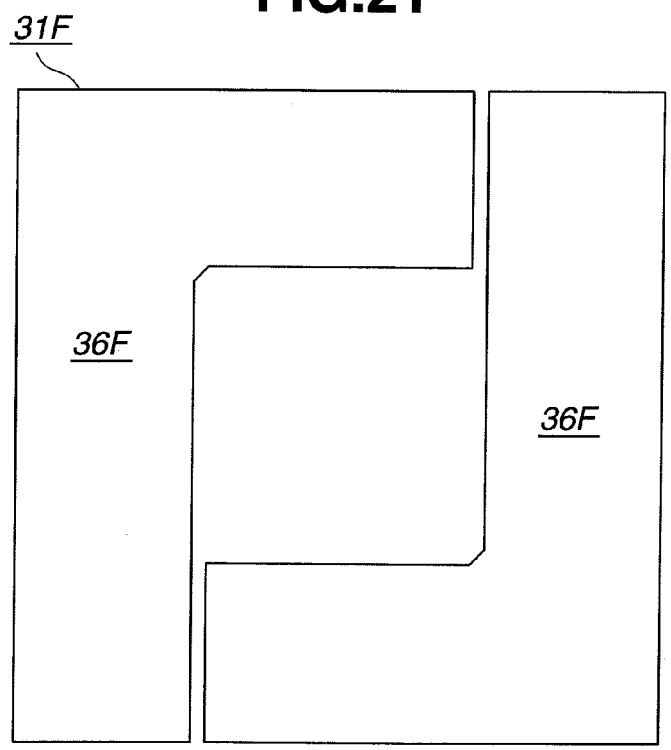
FIG. 21 is a perspective view of a stiffener for a wiring board according to a seventh embodiment of the present invention.

There is also provided a stiffener 31F for a wiring board as shown in FIG. 21 according to the seventh embodiment of the present invention. In the seventh embodiment, the stiffener 31F has two structural pieces 31F of e.g. L-shape in contrast to the first to sixth embodiments in which the stiffener 31, 31A, 31B, 31C, 31D, 31E has four structural pieces 36, 36A, 36B, 36C, 36D, 36E. There can alternatively be provided a stiffener with three, five or more structural pieces.

Figure 22:
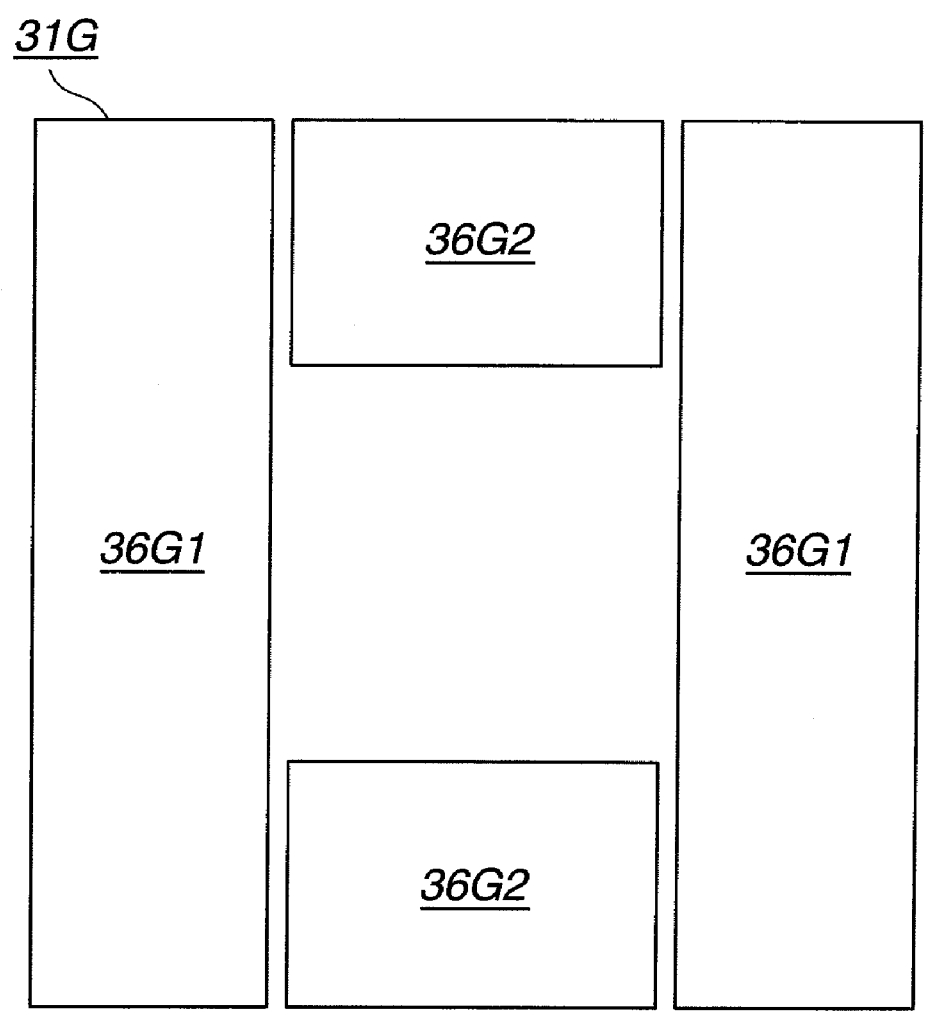
FIG. 22 is a perspective view of a stiffener for a wiring board according to an eighth embodiment of the present invention.

There is further provided a stiffener 31G for a wiring board as shown in FIG. 22 according to the eighth embodiment of the present invention. In the eighth embodiment, the stiffener 31G has structural pieces 36G1 and 36G2 of different shapes (the same width but different lengths) in contrast to the first to seventh embodiments in which the structural pieces 36, 36A, 36B, 36C, 36D, 36E, 36F of the stiffener 31, 31A, 31B, 31C, 31D, 31E, 31F are formed in the same shape and size.

Any of the stiffeners 31B to 31G can suitably be used in place of the stiffener 31, 31A.

[Ninth Embodiment]

Figure 23:
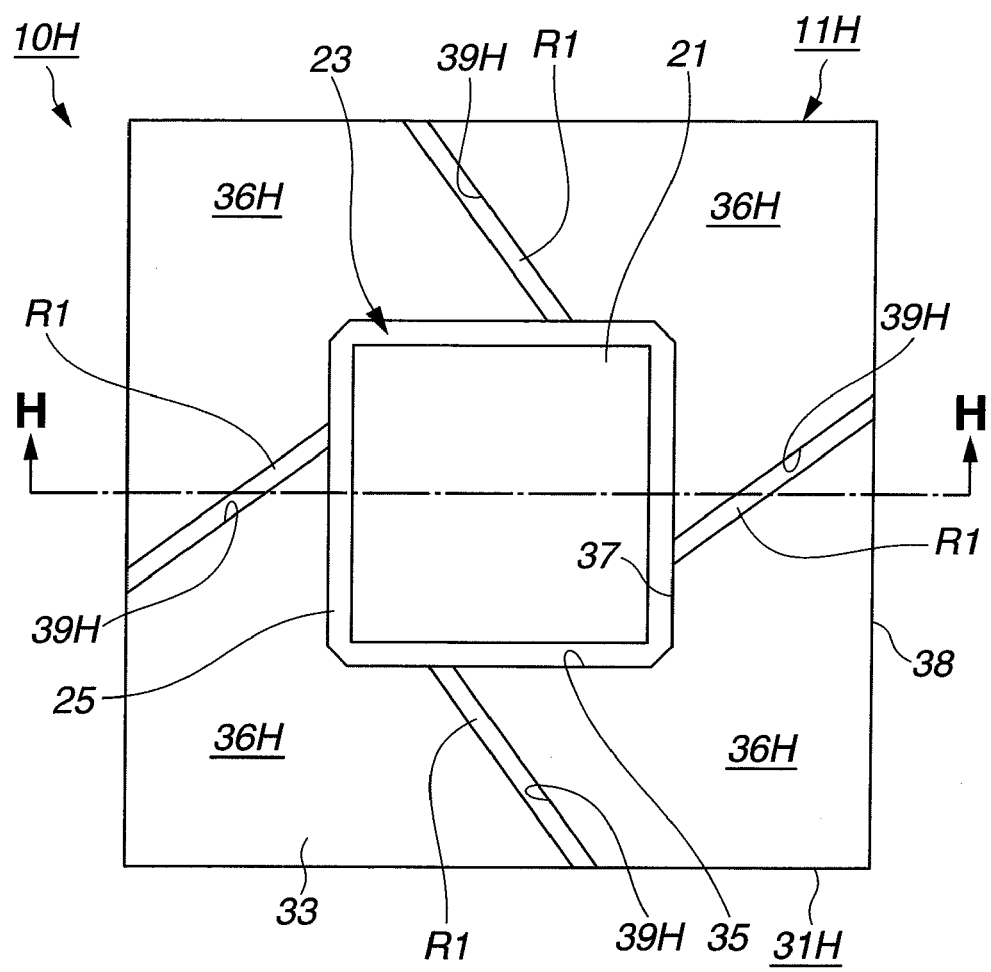
FIG. 23 is a top view of a wiring board assembly according to a ninth embodiment of the present invention.
Figure 24:
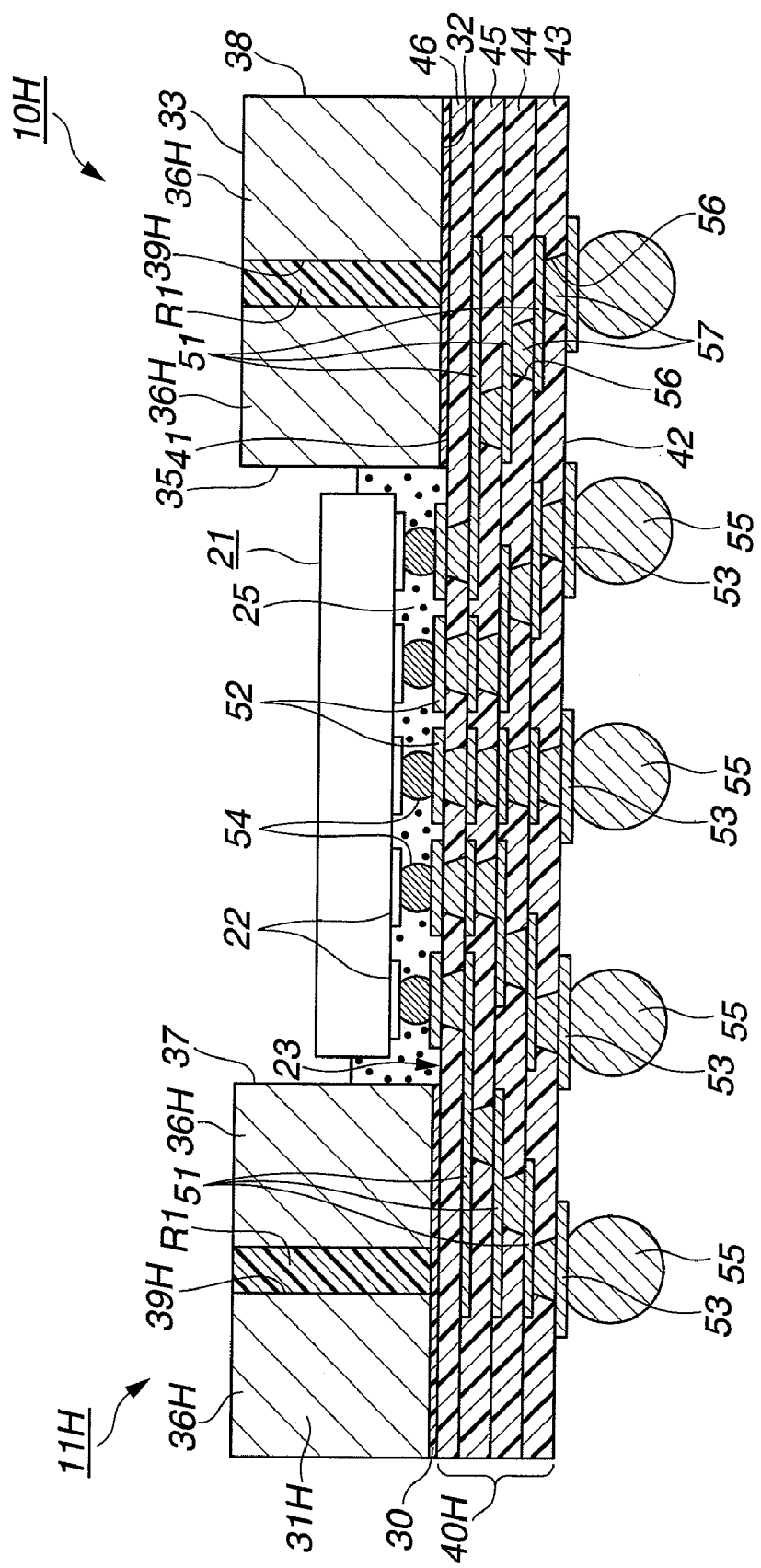
FIG. 24 is a section view of the wiring board assembly according to the ninth embodiment of the present invention.

As shown in FIGS. 23 and 24, a semiconductor package 10H according to the ninth embodiment of the present invention includes a wiring board 40H, a chip 21 mounted on the wiring board 40H and a stiffener 31H fixed as a reinforcing member to the wiring board 40H. The assembly of the wiring board 40H and the stiffener 31H and, occasionally, the chip 21 is referred to as a wiring board assembly 11H. The ninth embodiment is structurally similar to the above embodiments, except that the stiffener 31H has structural pieces 36H separated by slits 39H and bonded together by a resin material R1; and the clearance between the chip 21 and the top surface 41 of the wiring board 40H is filled with an underfill material 25. It is herein noted that the wiring board 40H is not necessarily a coreless wiring board in the ninth embodiment.

The slits 39H does not necessarily but preferably extend from the inner circumferential surface 37 to the outer circumferential surface 38 of the stiffener 31H so that the stiffener 31H is completely divided by the slits 39H into the separate structural pieces 36H. More specifically, the slits 39 extend linearly in a radial manner so as to be inclined with respect to and diagonally intersect the respective sides of the stiffener 31H in the ninth embodiment. The structural pieces 36H of the stiffener 31H are the same in shape and size. It is possible, by the formation of such slits 39H, to efficiently relieve a thermal stress applied to the stiffener 31H due to a difference in thermal expansion coefficient between the stiffener 31H and the wiring board 40 and to prevent warpage or bending of the wiring board 40H assuredly so that the chip 21 can be mounted on the wiring board 40H properly for improved yield rate and reliability of the semiconductor package 10H.

As mentioned above, it is assumed that the portions of the wiring board 40H corresponding to the slits 39H of the stiffener 31H are lower in rigidity and strength and are thus susceptible to warpage or bending. The chip mounting area 23 of the wiring board 40H may thus fail to secure sufficient flatness to mount thereon the chip 21. This is more pronounced when the wiring board 40H is a coreless wiring board.

As another technique to add rigidity and strength to these slit-corresponding portions of the wiring board 40H, the resin material R1 is filled in the slits 39H so that the structural pieces 36H of the stiffener 31H are bonded together by the resin material R1. It is thus possible to reinforce the slit-corresponding portions of the wiring board 40H and secure sufficient flatness in the chip mounting area 23 of the wiring board 40H.

The resin material R1 is not particularly restricted. Any known resin can be used as the resin material R1. In the ninth embodiment, the resin material R1 is a dedicated epoxy resin having a thermal expansion coefficient of about 40 ppm/° C., which is higher than the thermal expansion coefficient (about 30 ppm/° C.) of the resin of the resin insulation layers 43 to 46 of the wiring board 40H. Although the thermal expansion coefficient of the structural pieces 36H of the stiffener 31H, the thermal expansion coefficient of the wiring board 40H and the thermal expansion coefficient of the resin material R1 are not particularly limited and can be set as appropriate, it is preferable to satisfy such a relationship that: the thermal expansion coefficient of the structural pieces 36H of the stiffener 31H is lower than that of the wiring board 40H; and the thermal expansion coefficient of the resin material R1 is higher than that of the wiring board 40H. It is possible to relieve the thermal stress on the stiffener 31H efficiently upon satisfaction of the above thermal expansion coefficient relationship.

Alternatively, the resin material R1 can be the same resin as that used in the resin insulation layers 43 to 46. When the resin material R1 is the same as the material of the resin insulation layers 43 to 46, it is possible to secure compatibility of the resin material R1 with the resin insulation layers 43 to 46 and attain good adhesion between the stiffener 31H and the wiring board 40H. As there is no need to prepare the dedicated resin material to fill the slits 39H, it is easily possible to avoid complication of the manufacturing process and increase of the manufacturing cost of the wiring board assembly 11H.

The wiring board assembly 11H can be manufactured by the following procedure in the ninth embodiment. The wiring board production step and the solder bump forming step of the ninth embodiment are the same as those of the first embodiment.

Figure 25:
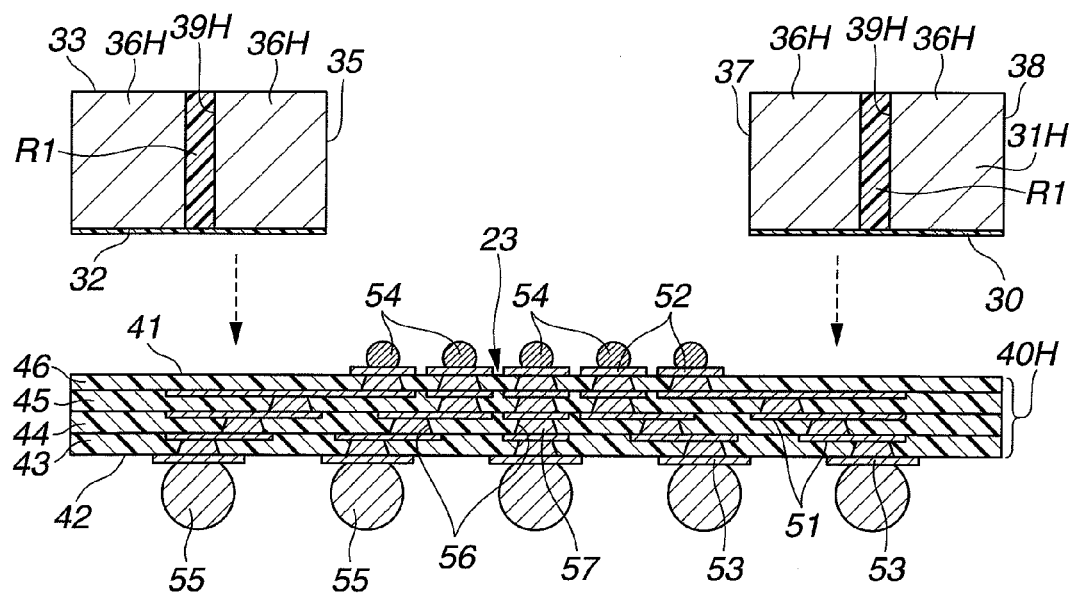
FIGS. 25 and 26 are schematic views showing one method of manufacturing the wiring board assembly according to the ninth embodiment of the present invention.

In the stiffener production step, the structural pieces 36 of the stiffener 31 are cut from a plate material (e.g. copper plate) with any known cutting machine and arranged in a two dimension by e.g. using a positioning mold in such a manner as to form the slits 39 of the same width between the structural pieces 36. The resin material R1 is prepared in uncured form and filled in the slits 39. At this time, each of the slits 39 can be fully filled with the resin material R1 (i.e. the resin material R1 can be filled to the full depth of the slits 39) or can be partially filled with the resin material R1. The resin material R1 is then cured by heat or ultraviolet radiation. As a result, the structural pieces 36 are bonded together by the resin material R1 and integrally assembled into the stiffener 31H as shown in FIG. 25.

Figure 26:
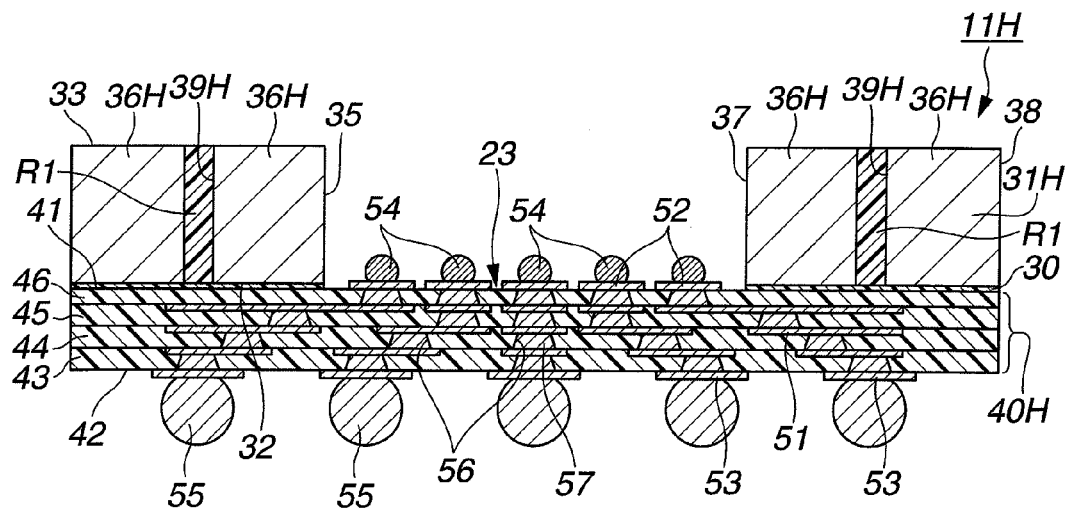

The stiffener 31H is fixed to the top surface 41 of the wiring board 40H in the fixing step. As shown in FIG. 25, the adhesive 30 is first applied to the joint surface 32 of the stiffener 31H. The stiffener 31H is then placed on the top surface 41 of the wiring board 40H to bring the joint surface 32 of the stiffener 31H into contact with the top surface 41 of the wiring board 40H as shown in FIG. 26. In this state, the adhesive 30 is cured with heating at e.g. about 150° C. Upon cooling the adhesive 30 to room temperature after the curing, the stiffener 31H is fixed by the adhesive 30 to the top surface 41 of the wiring board 40H.

After that, the chip 21 is mounted on the chip mounting area 23 of the wiring board 40H in the chip mounting step. The clearance between the chip 21 and the top surface 41 of the wiring board 40H is sealed by the underfill material 25.

In this way, the structural pieces 36H of the stiffener 31 are bonded together and physically integrated into one by filling the resin material R1 in the slits 39 before fixing the stiffener 31H to the wiring board 40H. It is thus possible to maintain the relative positions of the structural pieces 36H so that the stiffener 31H can be fixed to the wiring board 40H without misalignment of the structural pieces 36. This allows easy and assured manufacturing of the wiring board assembly 11H.

Figure 27:
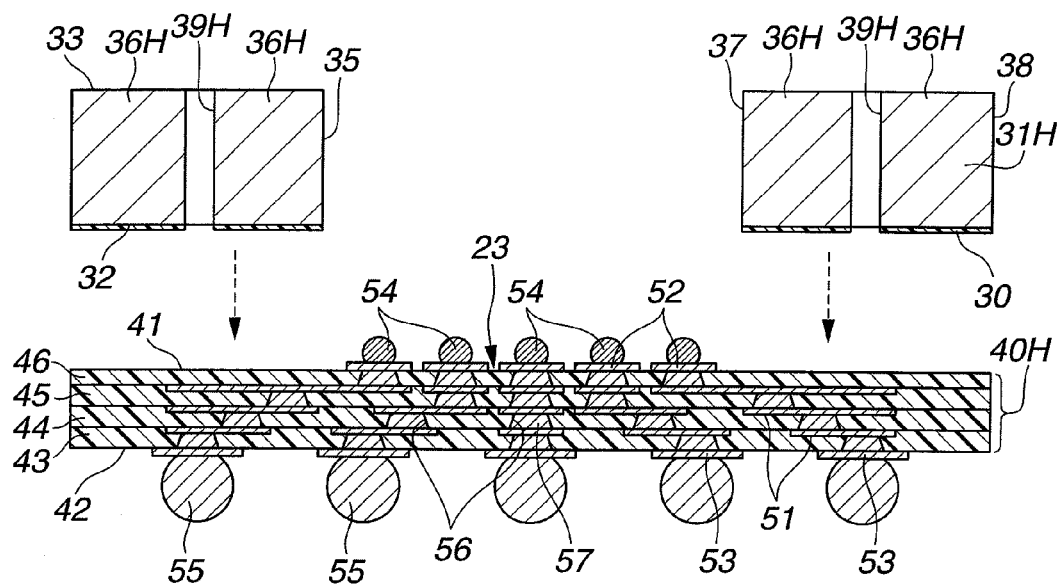
FIGS. 27 to 29 are schematic views showing another method of manufacturing the wiring board assembly according to the ninth embodiment of the present invention.
Figure 28:
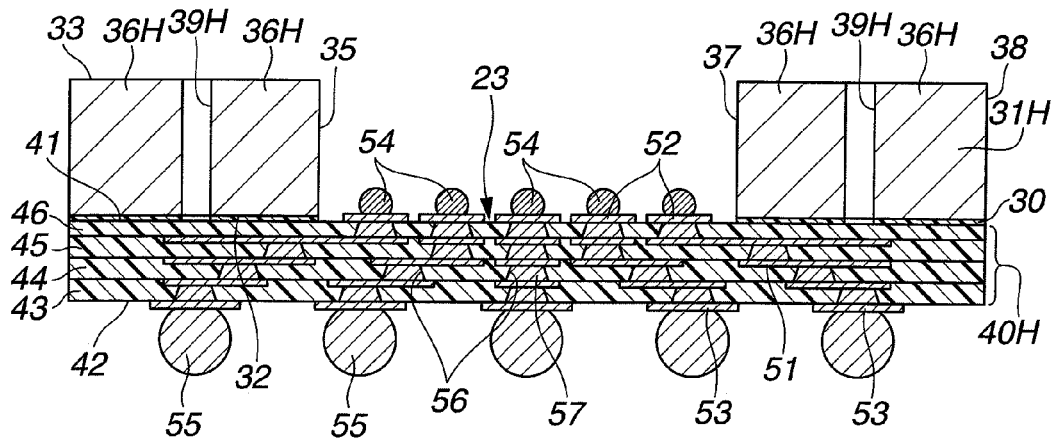
Figure 29:
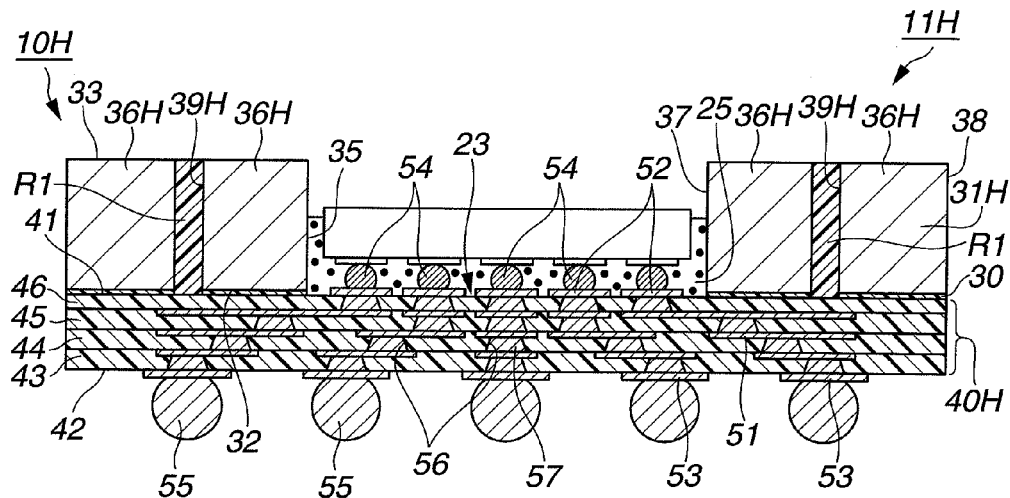

It is alternatively conceivable to fix the structural pieces 36H of the stiffener 31H to the top surface 41 of the wiring board 40H without the resin material R1 being filled in the slits 39H. In this case, the adhesive 30 is first applied to the joint surface 32 of each of the structural pieces 36H of the stiffener 31H as shown in FIG. 27. The structural pieces 36H of the stiffener 31H are then placed on the top surface 41 of the wiring board 40H to bring the joint surface 32 of each of the structural pieces 36H into contact with the top surface 41 of the wiring board 40H as shown in FIG. 28. The adhesive 30 is cured with heating at e.g. about 150° C. and cooled to room temperature after the curing. With this, the structural pieces 36 of the stiffener 31 are fixed by the adhesive 30 to the top surface 41 of the wiring board 40H. After that, the resin material R1 in uncured form is filled in the slits 39H and cured by heat or ultraviolet radiation so that the structural pieces 36H are bonded together by the resin material R1 and integrally assembled into the stiffener 31H as shown in FIG. 29. It is possible to manufacture the wiring board assembly 11H relatively easily and assuredly even by fixing the structural pieces 36H of the stiffener 31H to the wiring board 40H before filling the resin material R1 in the slits 39H.

[Tenth Embodiment]

Figure 30:
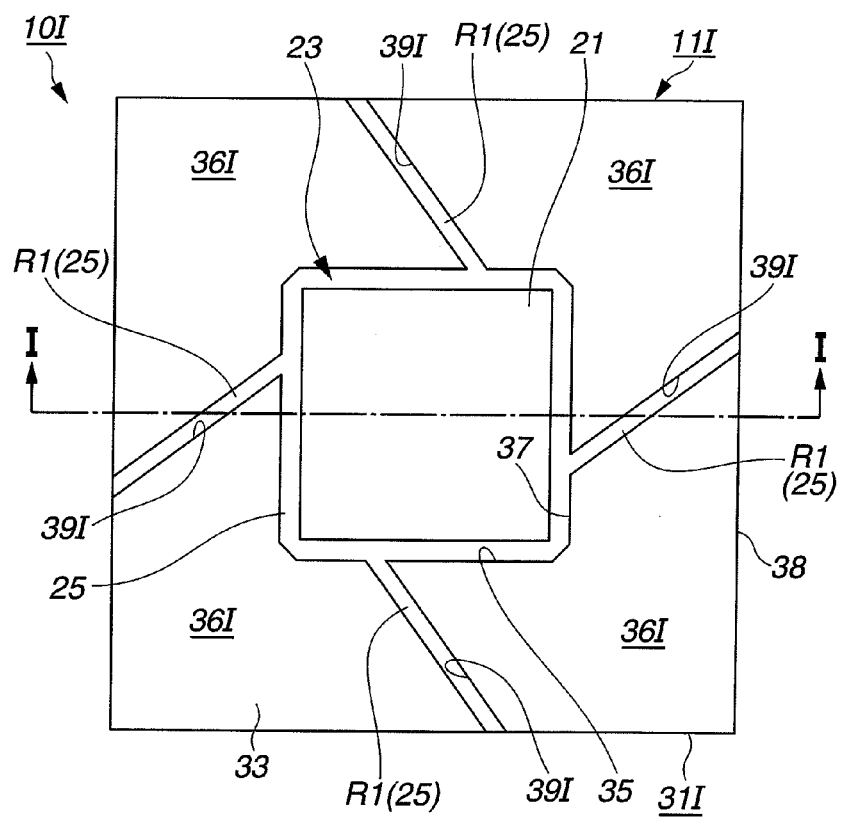
FIG. 30 is a top view of a wiring board assembly according to a tenth embodiment of the present invention.
Figure 31:
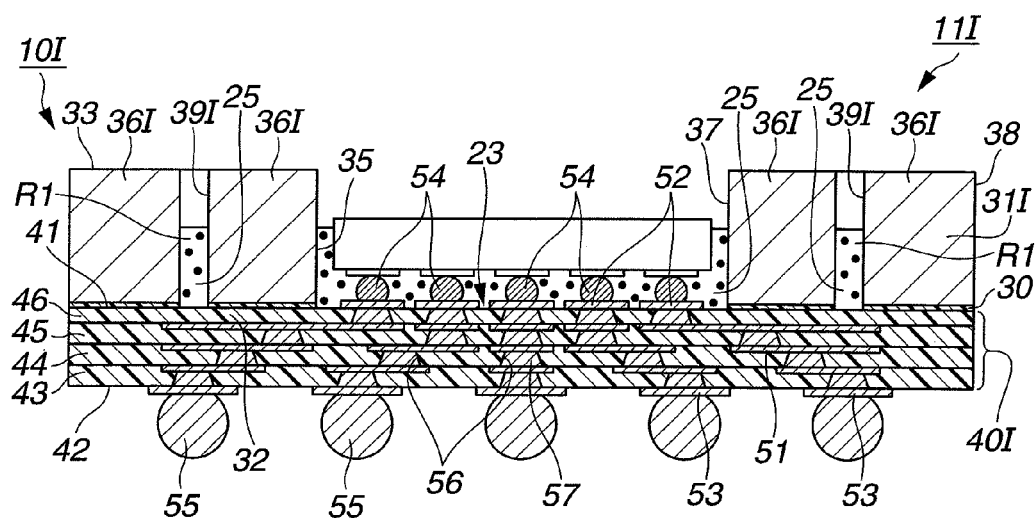
FIG. 31 is a section view of the wiring board assembly according to the tenth embodiment of the present invention.

A semiconductor package 10I according to the tenth embodiment of the present invention includes a wiring board 40I, a chip 21 mounted on the wiring board 40I and a stiffener 31 fixed as a reinforcing member to the wiring board 40I as shown in FIGS. 30 and 31. The assembly of the wiring board 40I and the stiffener 31 and, occasionally, the chip 21 is referred to as a wiring board assembly 11I. The stiffener 31I has a plurality of structural pieces 36I separated by slits 39I and bonded together by filling a resin material R1 in the slits 39I. The tenth embodiment is structurally similar to the ninth embodiment, except for the resin material R1 of the stiffener 31I.

In the tenth embodiment, the underfill material 25 is used not only to seal the clearance between the chip 21 and the top surface 41 of the wiring board 40I but also used as the resin material R1 to fill in the slits 39I and bond the structural pieces 36I of the stiffener 31I together. By forming the slits 39I in the stiffener 31I and filling the resin material R1 in the slits 39I, it is possible to relieve a thermal stress applied to the stiffener 31I due to a difference in thermal expansion coefficient between the stiffener 31I and the wiring board 40I, while providing sufficient rigidity to the wiring board 40I, and thereby possible to prevent warpage or bending of the wiring board 40I assuredly so that the chip 21 can be mounted on the wiring board 40I properly for improved yield rate and reliability of the semiconductor package 10I. It is further possible to secure compatibility of the resin material R1 with the underfill material 25 and attain good adhesion between the stiffener 31I and the wiring board 40I by using the same material as the resin material R1 and the underfill material 25. As there is no need to prepare the dedicated resin material to fill the slits 39I, it is easily possible to avoid complication of the manufacturing process and increase of the manufacturing cost of the wiring board assembly 11I.

The semiconductor package 10I is completed as follows in the tenth embodiment. The wiring board production step and the solder bump forming step are the same as above. The structural pieces 36I of the stiffener 31I are cut from a plate material and bonded by the adhesive 30 to the top surface 41 of the wiring board 40I without the resin material R1 (underfill material 25) being filled in the slits 39I between the structural pieces 36I. After the chip 21 is mounted on the chip mounting area 23 of the wiring board 40I, the underfill material 25 is simultaneously filled in the clearance between the chip 21 and the top surface 41 of the wiring board 40I and in the slits 39I between the structural pieces 36I of the stiffener 31I. It is possible to manufacture the semiconductor package 10I relatively easily and assuredly by such a procedure.

[Eleventh Embodiment]

Figure 32:
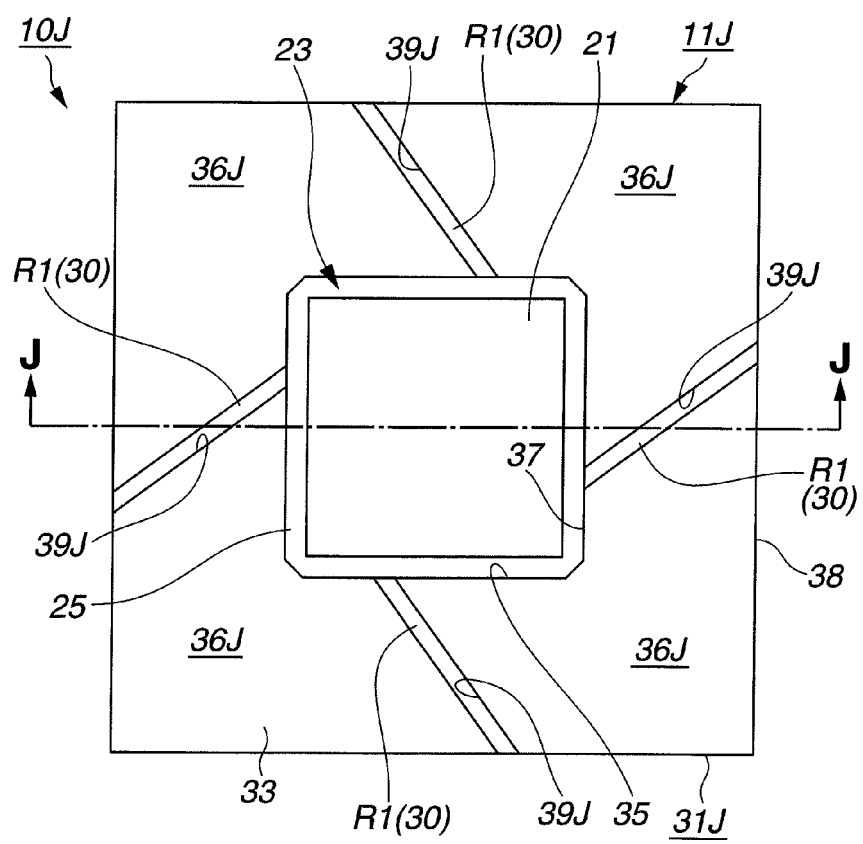
FIG. 32 is a top view of a wiring board assembly according to an eleventh embodiment of the present invention.
Figure 33:
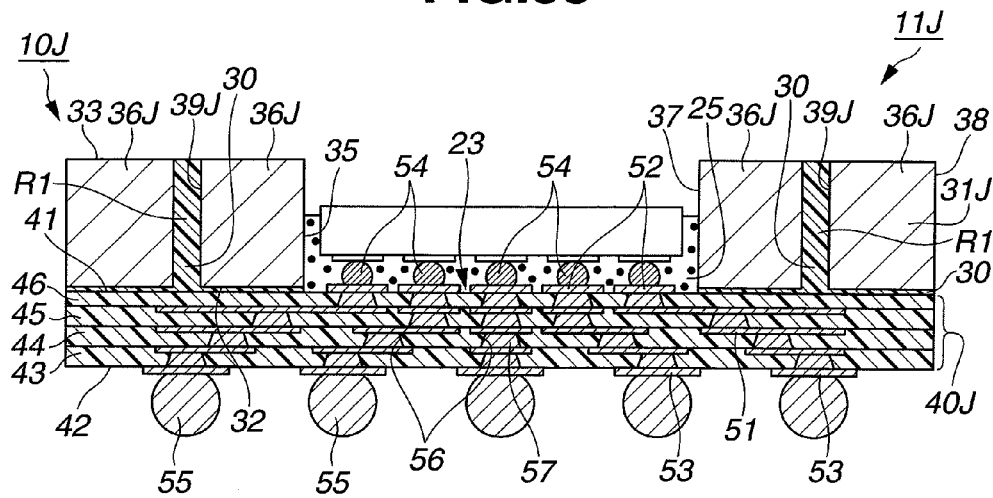
FIG. 33 is a section view of the wiring board assembly according to the eleventh embodiment of the present invention.

A semiconductor package 10J according to the eleventh embodiment of the present invention includes a wiring board 40J, a chip 21 mounted on the wiring board 40J and a stiffener 31J fixed as a reinforcing member to the wing board 40J as shown in FIGS. 32 and 33. The assembly of the wiring board 40J and the stiffener 31J and, occasionally, the chip 21 is referred to as a wiring board assembly 11J. The stiffener 31J has a plurality of structural pieces 36J separated by slits 39J and bonded together by filling a resin material R1 in the slits 39J. The eleventh embodiment is structurally similar to the ninth and tenth embodiments, except for the resin material R1 of the stiffener 30J.

In the eleventh embodiment, the adhesive 30 is used not only to fix the stiffener 31J to the top surface 41 of the wiring board 40J but also used as the resin material R1 to fill in the slits 39J and bond the structural pieces 36J of the stiffener 31J together. By forming the slits 39J in the stiffener 31J and filling the resin material R1 in the slits 39J, it is possible to relieve a thermal stress applied to the stiffener 31J due to a difference in thermal expansion coefficient between the stiffener 31J and the wiring board 40J, while providing sufficient rigidity to the wiring board 40J, and thereby possible to prevent warpage or bending of the wiring board 40J assuredly so that the chip 21 can be mounted on the wiring board 40J properly for improved yield rate and reliability of the semiconductor package 10J. As there is no need to prepare the dedicated resin material R1 to fill the slits 39J, it is easily possible to avoid complication of the manufacturing process of the wiring board assembly 11J and increase of the manufacturing cost of the wiring board assembly 11J.

The semiconductor package 10J is completed as follows in the tenth embodiment. The wiring board production step and the solder bump forming step are the same as above. The structural pieces 36J of the stiffener 31J are cut from a plate material. After the adhesive 30 is applied to the joint surface 32 of each of the structural pieces 36J of the stiffener 31J, the structural pieces 36 of the stiffener 31J are placed on the top surface 41 of the wiring board 40J. The resin material R1 (adhesive 30) is then filled in the slits 39J of the stiffener 31J. The adhesive 30 between the joint surface 32 of the stiffener 31J and the top surface 41 of the wiring board 40J is cured simultaneously with the resin material R1 (adhesive 30) in the slits of the stiffener 31J. Namely, the fixing step and the resin material filling step are completed simultaneously by using the same material as the resin material R1 and the adhesive 30. After the chip 21 is mounted on the chip mounting area 23 of the wiring board 40J, the underfill material 25 is filled in the clearance between the chip 21 and the top surface 41 of the wiring board 40J. It is possible to manufacture the semiconductor package 10J relatively easily and assuredly by such a procedure.

[Twelfth to Sixteenth Embodiments]

The shape and number of the structural pieces 36H, 36I, 36J (i.e. the form, position and number of the slits 39H, 39I, 39J) of the stiffener 31H, 31I, 31J are not particularly limited to the above and can be modified as appropriate as explained below.

Figure 34:
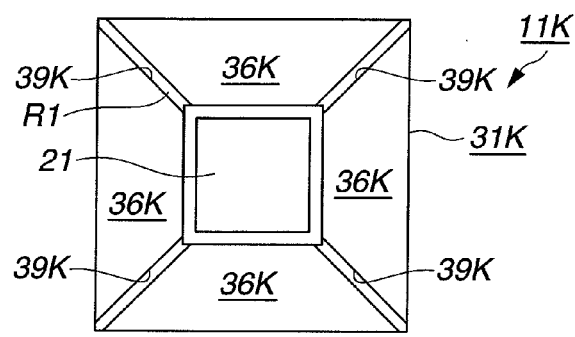
FIG. 34 is a top view of a wiring board assembly according to a twelfth embodiment of the present invention.

According to the twelfth embodiment of the present invention, there is provided a wiring board assembly 11K in which a stiffener 31K has four structural pieces 36K separated by four slits 39K and a resin material R1 filled in the slits 39K as shown in FIG. 34. In the twelfth embodiment, the slits 39J are formed linearly in corner portions of the stiffener 31K. The structural pieces 36K of the stiffener 31K are thus formed into a trapezoidal shape as viewed from the top and bonded together by the resin material R1.

Figure 35:
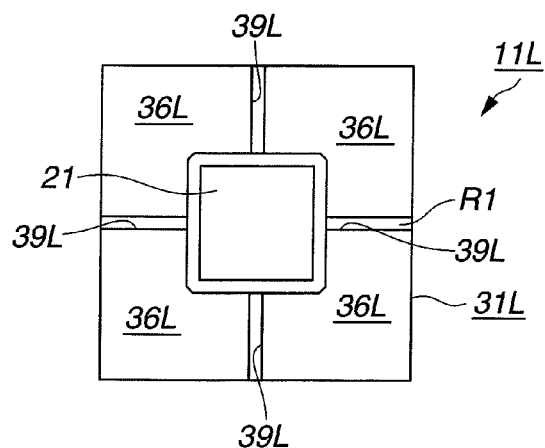
FIG. 35 is a top view of a wiring board assembly according to a thirteenth embodiment of the present invention.

According to the thirteenth embodiment of the present invention, there is provided a wiring board assembly 11L in which a stiffener 31L has four structural pieces 36L separated by four slits 39L and a resin material R1 filled in the slits 39L as shown in FIG. 35. In the thirteenth embodiment, the slits 39L are formed linearly in the centers of the four sides of the rectangular stiffener 31L so as to extend perpendicular to the sides of the stiffener 31L, respectively. The structural pieces 36L of the stiffener 31L have the same L shape and size and are bonded by the resin material R1.

Figure 36:
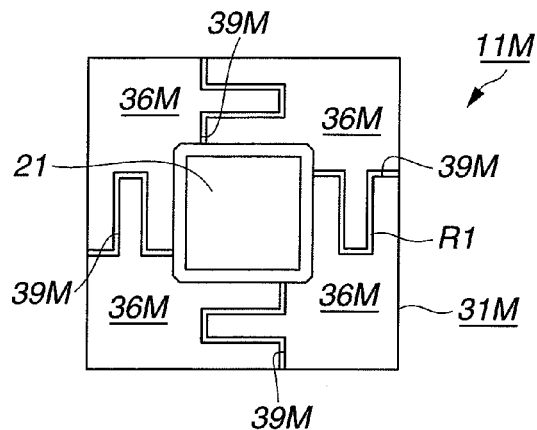
FIG. 36 is a top view of a wiring board assembly according to a fourteenth embodiment of the present invention.

According to the fourteenth embodiment of the present invention, there is a wiring board assembly 11M in which a stiffener 31M has four structural pieces 36M separated by four slits 39M and a resin material R1 filled in the slits 39M as shown in FIG. 36. In the fourteenth embodiment, the slits 39M are formed into a non-linear shape (more specifically, crank shape) as viewed from the top and bonded together by the resin material R1. The formation of such non-linear slits 39M allows the structural pieces 36M, even if displaced in position to relieve the thermal stress, to partly overlap each other in the plane direction of the stiffener 31M. The wiring board can be thus protected from warpage or bending assuredly by the overlap of the structural pieces 36M.

Figure 37:
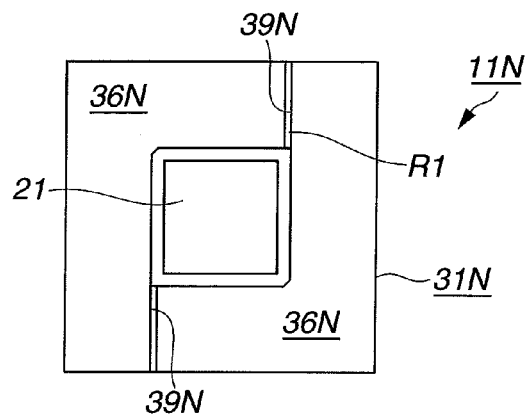
FIG. 37 is a top view of a wiring board assembly according to a fifteenth embodiment of the present invention.

According to the fifteenth embodiment of the present invention, there is provided a wiring board assembly 11N in which a stiffener 31N has two structural pieces 36N separated by slits 36 and a resin material R1 filled in the slits 36N as shown in FIG. 37. In the fifteenth embodiment, the structural pieces 36N of the stiffener 31N have the same L shape and size. There can alternatively be provided a stiffener with three, five or more structural pieces.

Figure 38:
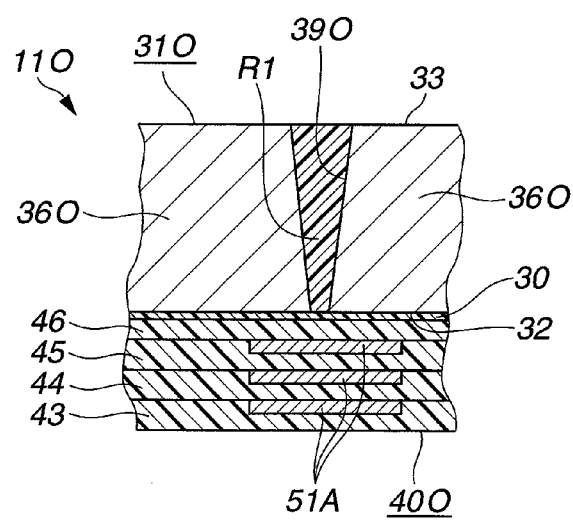
FIG. 38 is a section view of part of a wiring board assembly according to a sixteenth embodiment of the present invention.
Figure 39:
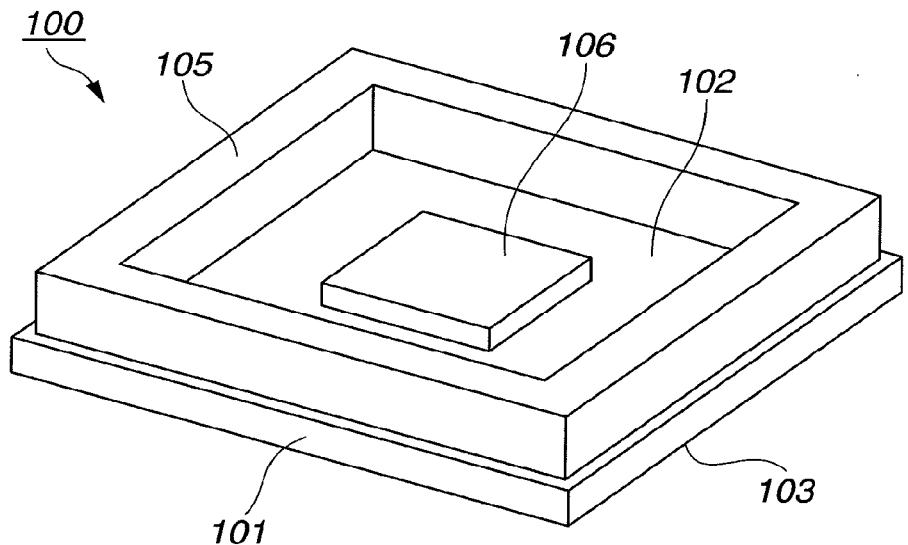
FIG. 39 is a perspective view of a conventional wiring board assembly.
Figure 40:
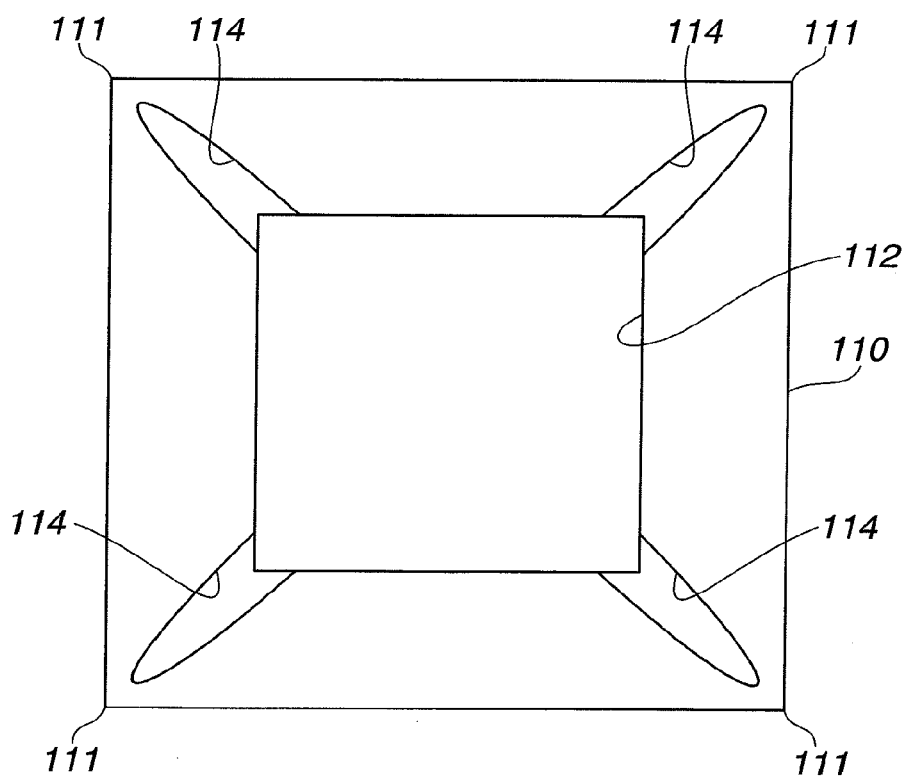
FIG. 40 is a top view of a conventional wiring board stiffer.

According to the sixteenth embodiment of the present invention, there is further provided a wiring board assembly 11O with a wiring board 40O and a stiffener 31O as shown in FIG. 38. The stiffener 31O has a plurality of structural pieces 36O separated by slits 39O and a resin material R1 filled in the slits 39O. In the sixteenth embodiment, each of the slits 39O is made smaller in width at the joint surface 32 than at the non-joint surface 33 of the stiffener 31O as in the case of the second embodiment. More specifically, the width of the slits 39O gradually decreases from the non-joint surface 33 to the joint surface 32 of the stiffener 31O so that the slits 39O are substantially V-shaped in cross section. It is possible to secure a wider area of the joint surface 32 of the stiffener 31O and fix the stiffener 31O to the wiring board 40O assuredly by decreasing the width of the slits 39O at the joint surface 32. It is also possible to secure wider openings of the slits 39O and fill the resin material R1 easily from such wide slit openings by increasing the width of the slits 39O at the non-joint surface 33. Further, the wiring board 40O includes plain conduction layers 51A each arranged between adjacent ones of the resin insulation layers 43 to 46 at positions corresponding to each of the slits 39O in the sixteenth embodiment as in the case of the second embodiment. The plain conduction layers 51A are dummy conductors that do not have no connections to the via conductors 57 and thus do not perform an electrical function, but perform the function to reinforce the portions of the wiring board 40O corresponding to the slits 39O of the stiffener 31O. It is thus possible to provide the wiring board assembly 11O with sufficient rigidity and strength so that the chip mounting area 23 of the wiring board 40O can secure flatness to mount thereon the chip 21.

The entire contents of Japanese Patent Application No. 2009-033314 (filed on Feb. 16, 2009) and No. 2009-133548 (filed on Jun. 2, 2009) are herein incorporated by reference.

Although the present invention has been described with reference to the above-specific embodiments of the invention, the invention is not limited to these exemplary embodiments. Various modification and variation of the embodiments described above will occur to those skilled in the art in light of the above teachings.

For example, the slits 39, 39B, 39C, 39D, 39E, 39F, 39G, 39H, 39I, 39J, 39K, 39L, 39N can be made smaller in width at the joint surface 32 than at the non-joint surface 33 of the stiffener 31, 31B, 31C, 31D, 31E, 31F, 31G, 31H, 31I, 31J, 31K, 31L, 31N in the first and third to fifteenth embodiments as in the case of the second and sixteenth embodiments.

The plain conductors 51A can also be provided in the wiring board 40, 40B, 40C, 40D, 40E, 40F, 40G, 40H, 40I, 40J, 40K, 40L, 40N in the first and third to fifteenth embodiments as in the case of the second and sixteenth embodiments.

The resin material R1 can be either any dedicated resin material, the same resin material as that of the resin insulation layers 43 to 46, the underfill material 25, or the adhesive 30 in the twelfth to sixteenth embodiments.

Moreover, there can be provided according to another aspect of the present invention a wiring board assembly comprising: a rectangular plate-shaped wiring board having a plurality of resin insulation layers and conduction layers alternately laminated together to define opposite first and second surfaces and a plurality of connection terminals arranged on the first main surface for surface contact with terminals of a chip; and a rectangular frame-shaped reinforcing member fixed to the first main surface of the wiring board with the connection terminals exposed through an opening of the reinforcing member, the reinforcing member having a plurality of structural pieces separated by the slits and a resin material filled in the slits to bond the structural pieces together, wherein the structural pieces of the reinforcing member have a lower thermal expansion coefficient than that of the wiring board; and wherein the resin material of the reinforcing material has a higher thermal expansion coefficient than that of the wiring board.

The scope of the invention is defined with reference to the following claims.

What is claimed is:

1. A wiring board assembly, comprising:
a rectangular plate-shaped wiring board having a plurality of resin insulation layers and conduction layers alternately laminated together to define opposite first and second main surfaces and a plurality of connection terminals arranged on a chip mounting area of the first main surface for surface contact with terminals of a chip; and
a rectangular frame-shaped reinforcing member fixed to the first main surface of the wiring board with the connection terminals exposed through an opening of the reinforcing member, the reinforcing member having a plurality of structural pieces separated by slits that extend from an inner circumferential surface to an outer circumferential surface of the reinforcing member and arranged on a circumferential area around the chip mounting area of the first surface so as to surround the connection terminals.

2. The wiring board assembly according to claim 1, wherein the slits are nonlinear in shape.

3. The wiring board assembly according to claim 2, wherein the slits are formed into a crank shape.

4. The wiring board assembly according to claim 1, wherein the reinforcing member has a joint surface joined to the first main surface of the wiring board and a non-joint surface located opposite from the joint surface; and wherein the slits are smaller in width at the joint surface of the reinforcing member than at the non-joint surface of the reinforcing member.

5. The wiring board assembly according to claim 1, wherein the conduction layers of the wiring board includes plain conduction layers located so as to correspond in position to the slits of the reinforcing member.

6. The wiring board assembly according to claim 1, wherein the reinforcing member has a resin material filled in the slits to bond the structural pieces together by the resin material.

7. The wiring board assembly according to claim 6, wherein the resin material of the reinforcing member is the same material as that of the resin insulation layers of the wiring board.

8. The wiring board assembly according to claim 6, wherein the resin material of the reinforcing member is the same material as an underfill material filled in a clearance between the chip and the first main surface of the wiring board.

9. The wiring board assembly according to claim 6, wherein the reinforcing member is fixed to the first main surface of the wiring board by an adhesive; and wherein the resin material of the reinforcing member is the same material as the adhesive.

10. The wiring board assembly according to claim 1, wherein the structural pieces are placed in a frame-shaped arrangement such that the reinforcing member is kept from contact with the chip.

11. A wiring board assembly, comprising:
- a rectangular plate-shaped wiring board having a plurality of resin insulation layers and conduction layers alternately laminated together to define opposite first and second main surfaces and a plurality of connection terminals arranged on a chip mounting area of the first main surface for surface contact with terminals of a chip; and
- a rectangular frame-shaped reinforcing member fixed to the first main surface of the wiring board with the connection terminals exposed through an opening of the reinforcing member, the reinforcing member having a plurality of structural pieces separated by slits and a resin material filled in the slits to bond the structural pieces together by the resin material and arranged on a circumferential area around the chip mounting area of the first surface so as to surround the connection terminals.

12. The wiring board assembly according to claim 11, wherein the slits extend from an inner circumferential surface to an outer circumferential surface of the reinforcing member.

13. The wiring board assembly according to claim 11, wherein the reinforcing member has a joint surface joined to the first main surface of the wiring board and a non-joint surface located opposite from the joint surface; and wherein the slits are smaller in width at the joint surface of the reinforcing member than at the non-joint surface of the reinforcing member.

14. The wiring board assembly according to claim 11, wherein the resin material of the reinforcing member is the same material as that of the resin insulation layers of the wiring board.

15. The wiring board assembly according to claim 11, wherein the resin material of the reinforcing member is the same material as an underfill material filled in a clearance between the chip and the first main surface of the wiring board.

16. The wiring board assembly according to claim 11, wherein the reinforcing member is fixed to the first main surface of the wiring board by an adhesive; and wherein the resin material of the reinforcing member is the same material as the adhesive.

\* \* \* \* \*